United States Patent [19]
Jordan et al.

[11] Patent Number: 5,892,203
[45] Date of Patent: Apr. 6, 1999

[54] APPARATUS FOR MAKING LAMINATED INTEGRATED CIRCUIT DEVICES

[75] Inventors: Stanley Robert Jordan, Boca Raton; Gary Leon Stewart, Lake Worth; Ralph Trollinger, Pompano Beach, all of Fla.

[73] Assignee: International Business Machines Corporation, Armonk, N.Y.

[21] Appl. No.: 654,999

[22] Filed: May 29, 1996

[51] Int. Cl.⁶ ............................... F27B 5/06; F27D 5/00; H05B 3/22
[52] U.S. Cl. .......................... 219/393; 219/385; 219/393; 156/288; 264/263
[58] Field of Search ..................................... 219/385, 386, 219/390, 393, 396, 521, 405, 411; 156/228, 264, 288, 89, 321; 29/738; 264/263; 427/553, 557, 559, 585, 587, 592

[56] References Cited

U.S. PATENT DOCUMENTS

| | | | |
|---|---|---|---|
| 2,351,058 | 6/1944 | Marks | 100/90 |
| 2,354,692 | 8/1944 | Marks | 156/382 |
| 3,284,884 | 11/1966 | Prazak | 269/319 |
| 3,842,794 | 10/1974 | Ing | 219/405 |
| 3,960,635 | 6/1976 | La Roy et al. | 156/286 |
| 3,971,875 | 7/1976 | Regalbuto | 219/390 |
| 4,186,916 | 2/1980 | Varga | 269/303 |
| 4,342,090 | 7/1982 | Caccoma et al. | 364/491 |
| 4,421,589 | 12/1983 | Armini et al. | 156/382 |
| 4,617,160 | 10/1986 | Belanger et al. | 264/263 |
| 4,646,128 | 2/1987 | Carson et al. . | |
| 4,666,551 | 5/1987 | Soberay et al. | 156/382 |
| 4,672,737 | 6/1987 | Carson et al. . | |
| 4,689,105 | 8/1987 | Fazlin et al. | 156/382 |
| 4,695,707 | 9/1987 | Young | 219/521 |
| 4,704,319 | 11/1987 | Belanger . | |
| 4,706,166 | 11/1987 | Go . | |
| 4,764,846 | 8/1988 | Go . | |
| 4,776,919 | 10/1988 | Troutner et al. | 156/499 |
| 4,806,195 | 2/1989 | Namsyl | 156/382 |
| 4,954,206 | 9/1990 | Voss | 156/537 |
| 4,963,221 | 10/1990 | Isobe et al. | 156/358 |
| 4,983,533 | 1/1991 | Go . | |
| 5,045,685 | 9/1991 | Wall . | |
| 5,104,820 | 4/1992 | Go et al. . | |
| 5,169,310 | 12/1992 | Chance et al. | 156/89 |
| 5,182,121 | 1/1993 | Miyashita et al. | 425/338 |
| 5,186,973 | 2/1993 | Garg et al. | 427/587 |
| 5,201,981 | 4/1993 | Whiteside | 156/212 |
| 5,218,515 | 6/1993 | Bernhardt . | |
| 5,241,450 | 8/1993 | Bernhardt et al. . | |
| 5,254,205 | 10/1993 | Tsutsumi et al. | 156/538 |
| 5,279,991 | 1/1994 | Minahan et al. . | |
| 5,297,480 | 3/1994 | Miyashita et al. | 100/90 |
| 5,347,428 | 9/1994 | Carson et al. . | |
| 5,389,346 | 2/1995 | Copeland, Jr. | 100/90 |
| 5,399,223 | 3/1995 | Vogt | 156/285 |
| 5,424,920 | 6/1995 | Miyake . | |
| 5,432,318 | 7/1995 | Minahan . | |
| 5,432,729 | 7/1995 | Carson et al. . | |
| 5,468,315 | 11/1995 | Okada et al. | 156/64 |
| 5,496,433 | 3/1996 | Miyashita et al. | 156/358 |
| 5,555,798 | 9/1996 | Miyashita et al. | 100/93 P |
| 5,578,159 | 11/1996 | Miyashita et al. | 156/358 |
| 5,595,241 | 1/1997 | Jelinek | 219/405 |
| 5,635,010 | 6/1997 | Pepe et al. | 156/264 |

FOREIGN PATENT DOCUMENTS

| | | | |
|---|---|---|---|
| 2019-434-A | 1/1987 | Japan | 156/64 |

*Primary Examiner*—Teresa Walberg
*Assistant Examiner*—J. Pelham
*Attorney, Agent, or Firm*—Quarles & Brady

[57] ABSTRACT

An apparatus for producing laminated integrated circuit cubes includes a hermetically sealable oven chamber. At least one conductive heating device is used to heat the cube to a cure temperature. A vacuum source is connected to the oven chamber to remove gas from between the integrated circuit layers prior to curing. A press device applies pressure to the cube while it is heated under vacuum. A cooling gas is circulated through the oven chamber after curing. A cooling fluid can also be circulated through cooling channels in at least one wall of the oven chamber to cool the chamber.

14 Claims, 18 Drawing Sheets

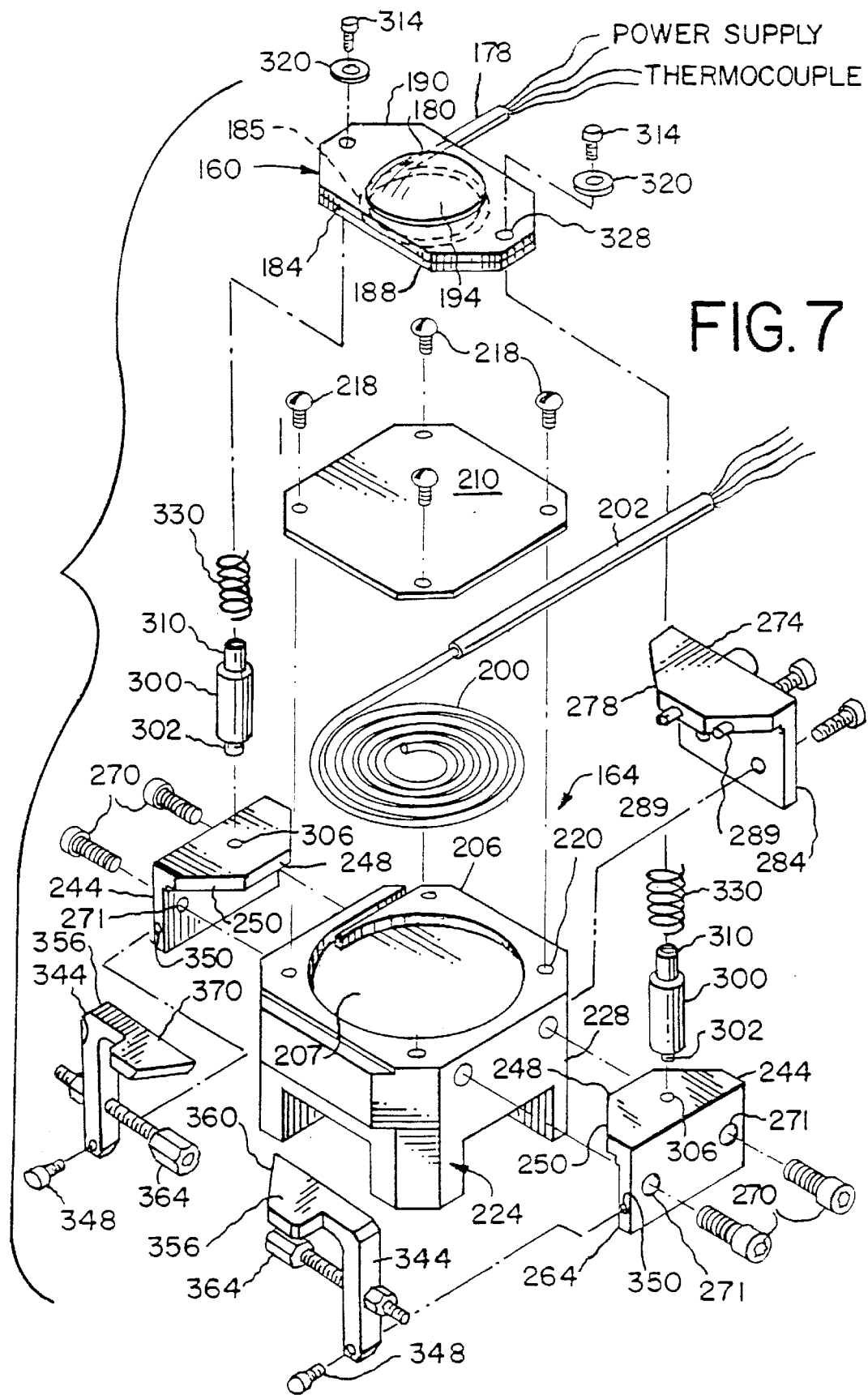

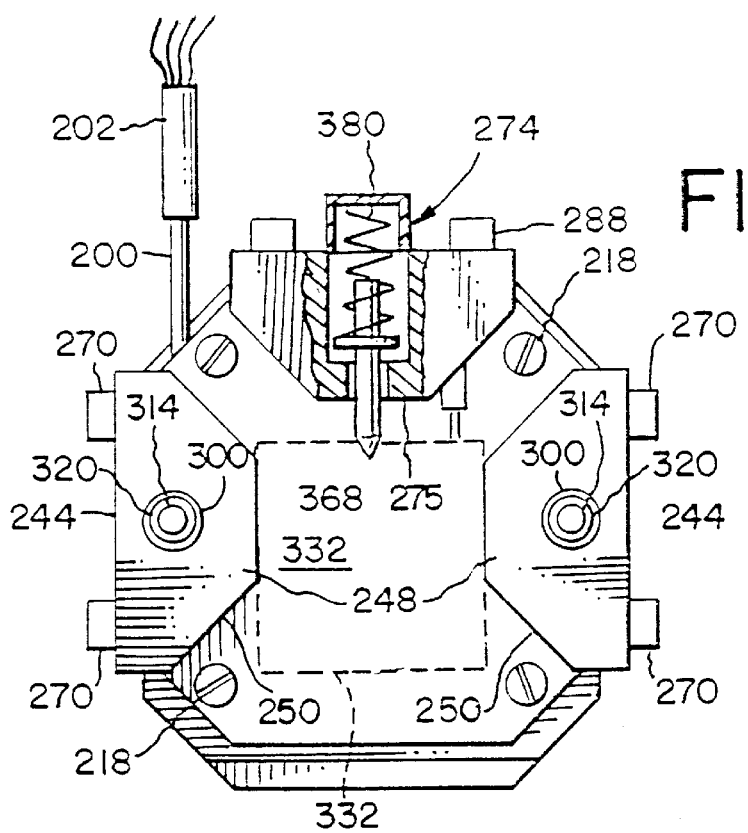
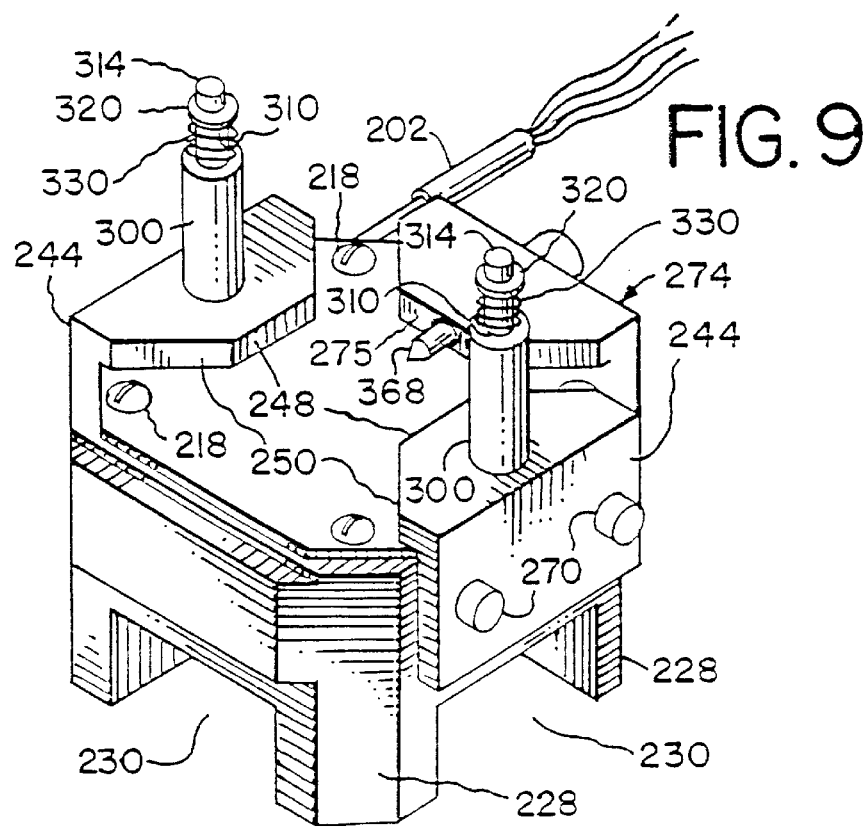

APPARATUS FOR MAKING LAMINATED INTEGRATED CIRCUIT DEVICES

BACKGROUND OF THE INVENTION

This invention relates generally to apparatus for making laminated integrated circuit devices (LICDs).

DESCRIPTION OF THE RELEVANT ART

The lamination of single layer integrated circuit chips into a multiple layer device, sometimes referenced by the art as a "cube", is used to package several of such chips in a convenient unit device. Such cubes are especially desirable where limited space is available, for example, on missiles and satellites, but they are also useful in other devices where space saving is desirable. The manufacture of such cubes typically utilizes an adhesive such as a polyimide to adhere the single layer chips together. The adhesive must be cured with heat, and preferably under a vacuum to remove air and other gases from between the circuit layers. Further, pressure is applied to the cube during curing to form a compact, tightly adhered structure.

SUMMARY OF THE INVENTION

The invention provides an apparatus for making cubes which utilizes a cube lamination oven. The lamination oven is capable of being hermetically sealed. A vacuum source removes air and other gases from the oven. At least one conductive heating device is provided to heat the cube. A press device is provided to apply a force to the cube. A cooling gas is used to cool the cube following the heat-curing step.

The device for conductively heating the cube is preferably a cube contact heater assembly. The cube contact heater assembly preferably has at least two heating elements, which are used to apply heat to the cube in at least two locations to provide for more even heating of the cube. Most preferably, upper and lower heating elements are provided in upper and lower heating plates. The plates are heated by the heating elements and conduct heat to the cube.

The cube lamination oven is provided to apply vacuum to the cube while the cube is being heated by the heating elements. A vacuum will remove air and other gases from the space surrounding the cube. The oven preferably also provides structure for measurement of the temperature of the cube and of portions of the oven. The temperature-measuring structure can be thermocouples or other suitable structure. The oven also preferably provides for a non-contact temperature measurement of the cube, such as infrared temperature sensing. The oven can be dimensioned to hold a plurality of contact heater assemblies, to permit the fabrication of several cubes simultaneously. The oven has a reclosable door, preferably hinged, which can be sealed to withstand vacuum to $10^{-3}$ torr or greater.

Cooling systems preferably are provided to cool the cube and the walls of the oven during the cooling cycle. A source of cooling gas such as nitrogen is provided to flow gas into the oven and cool the cubes after heating. The openings are sealed with special medium vacuum fittings. Heating cables are fed through the chamber, and also sealed with medium vacuum fittings. Pressure relief structure is preferably provided with the oven in case the pressure of the cooling gas in the oven should reach unacceptable levels.

A press device is provided to apply a force to the cube while it is heated in the vacuum chamber. The press device applies the force through a shaft or other force-applying member. Press devices can be provided within the oven, however, access ports are preferably provided for permitting the introduction of mechanical force-applying members into the oven. Sealing structure is provided to seal the oven chamber and to permit the passage of the force-applying member through the chamber wall. Biasing structure can be provided to hold the force-applying member against the vacuum force of the oven chamber, to prevent the force-applying member from being pulled into the chamber before it is required. The force-applying member is preferably made of a material which can withstand the force and will not transfer heat out of the oven chamber. Air cylinders are preferably utilized to apply force to the force-applying member. Electric cylinders or alternative force-generating structure is also possible.

The process is preferably controlled by a programmable logic controller or any computer with sufficient processing capabilities. The heating elements, press device, and cooling fluid flow controls can have predetermined set point values, start and stop times, and ramp-up and ramp-down rates which can be programmed into, and controlled by, the programmable logic controller.

BRIEF DESCRIPTION OF THE DRAWINGS

There are shown in the drawings embodiments which are presently preferred, it being understood, however, that the invention is not limited to the precise arrangements and instrumentalities shown, wherein:

FIG. 7 is an exploded perspective view of a cube contact heater assembly.

FIG. 8 is a plan view of a cube contact heater assembly.

FIG. 9 is a perspective view of a cube contact heater assembly.

DETAILED DESCRIPTION OF THE PREFERRED EMBODIMENTS

Figure 1:
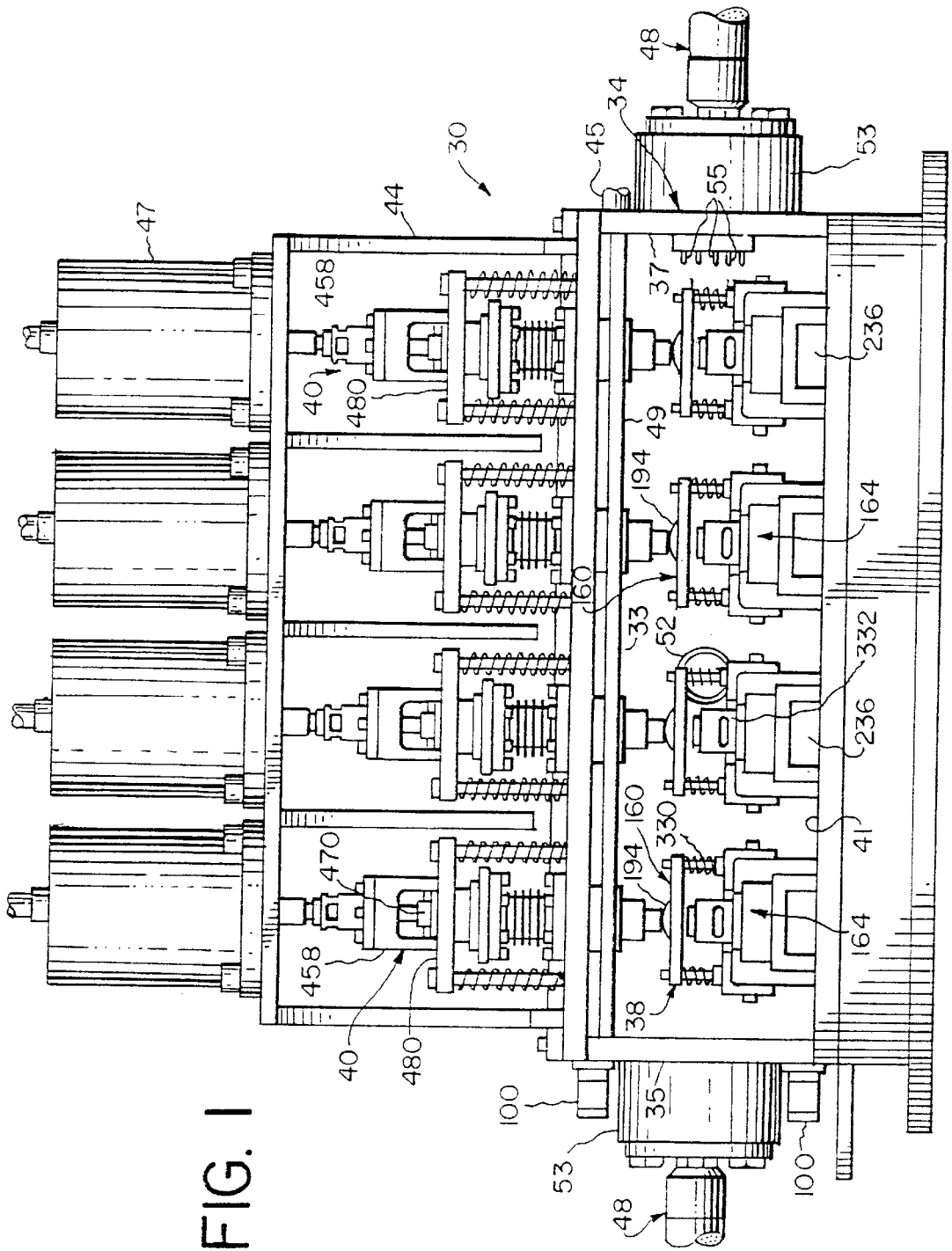
FIG. 1 is a front elevation of a cube laminating oven according to the invention, with the door to the oven and the face plate over the press devices removed.
Figure 2:
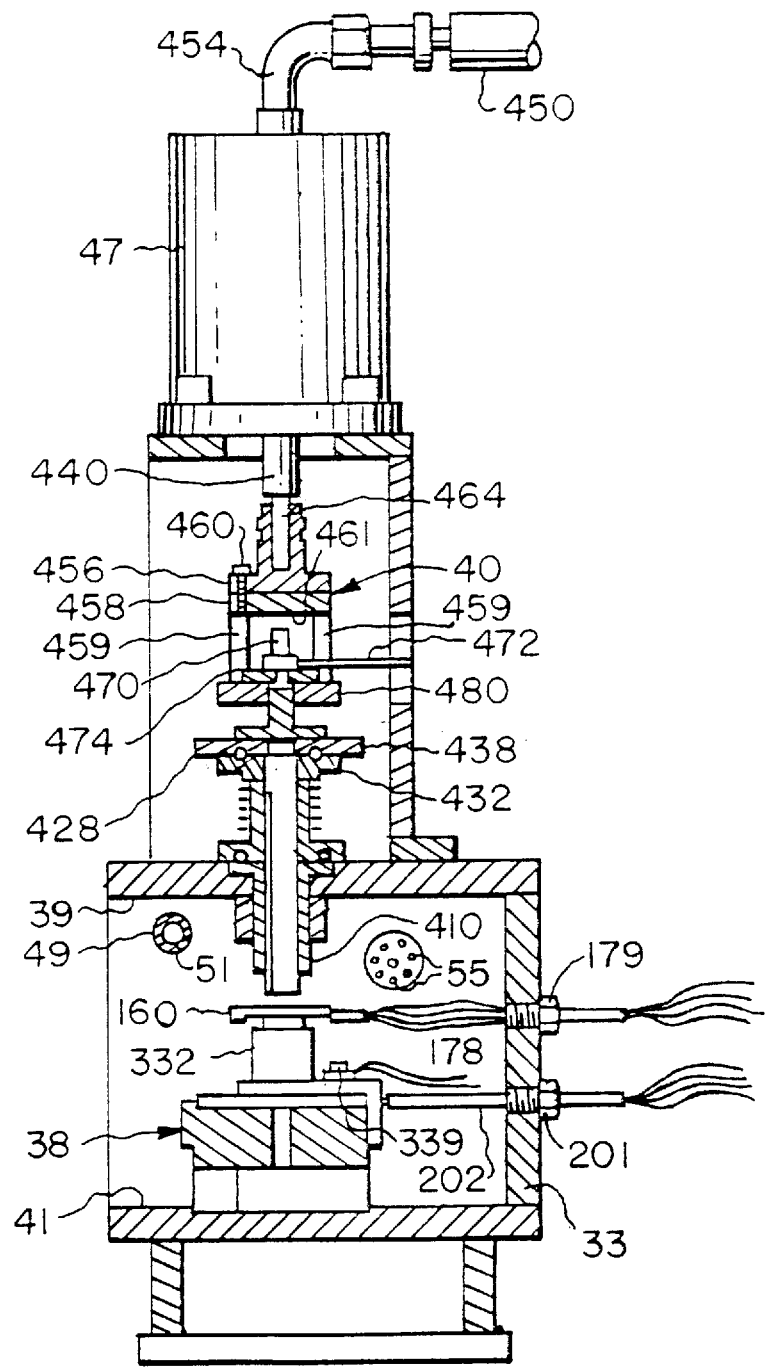
FIG. 2 is a cross section taken along line 2—2 in FIG. 1.
Figure 3:
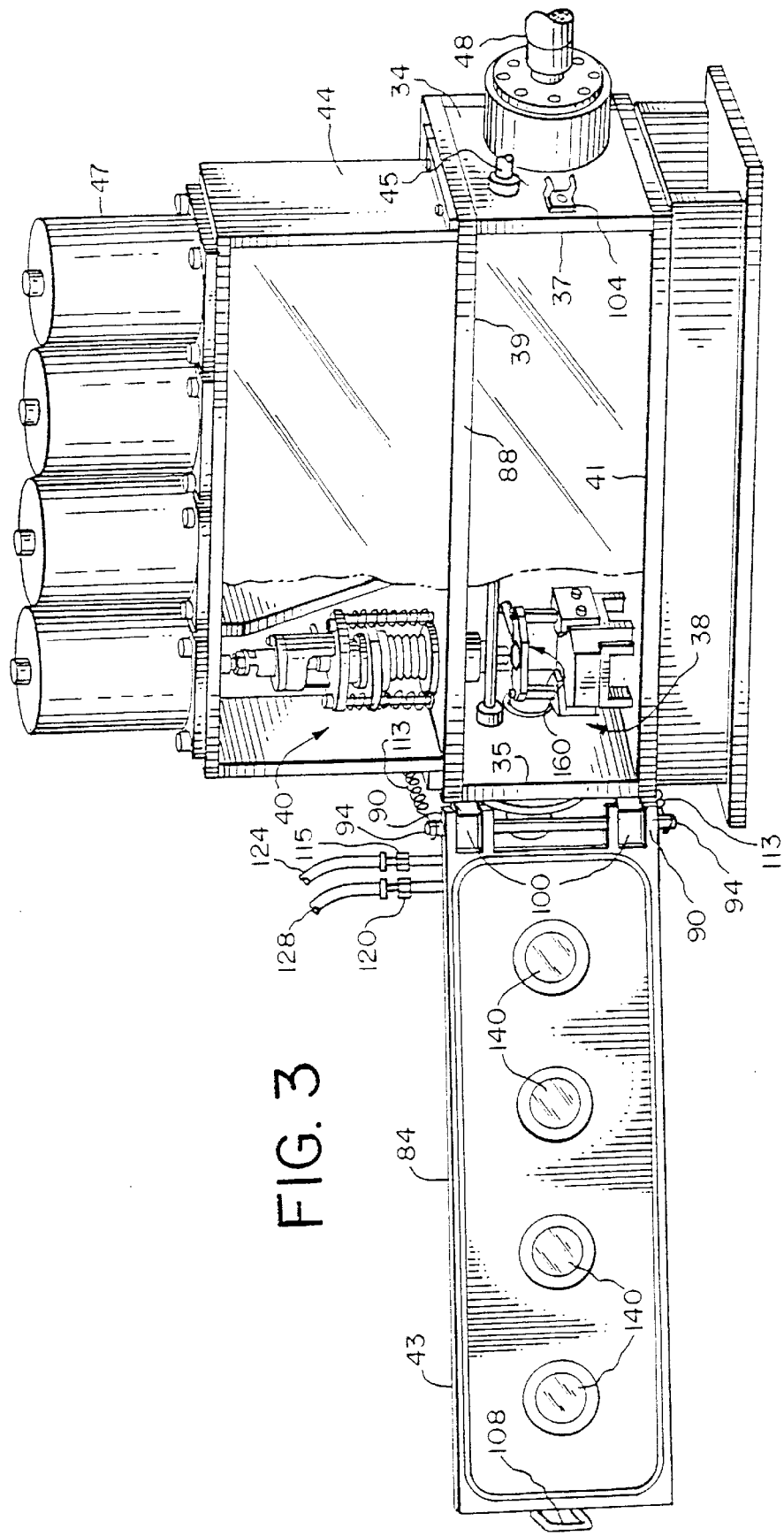
FIG. 3 is a perspective view, partially broken away, with the door to the oven and the face plate in place.
Figure 4:
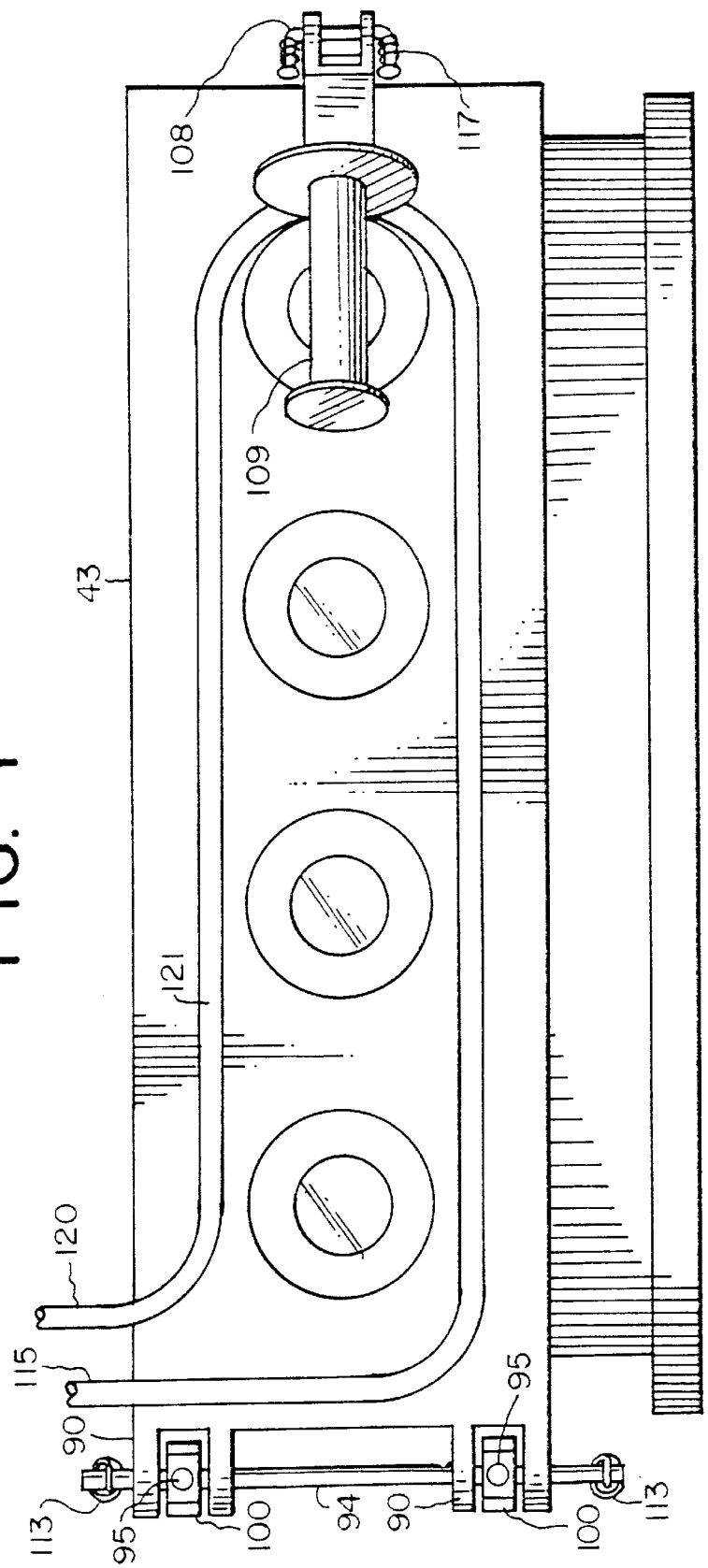
FIG. 4 is a front elevation of an oven door according to one embodiment of the invention.
Figure 5:
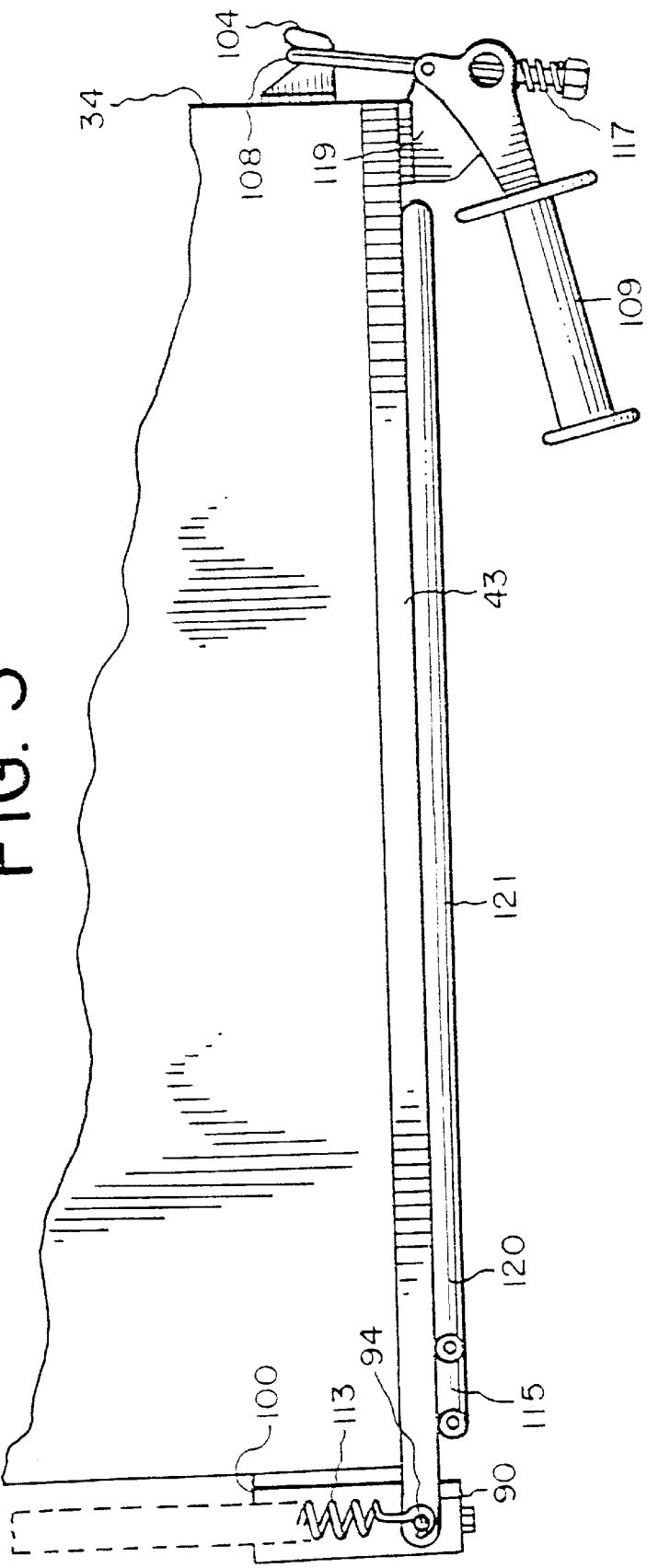
FIG. 5 is a top plan view, partially in phantom and partially broken away, of an oven chamber according to the invention.
Figure 6:
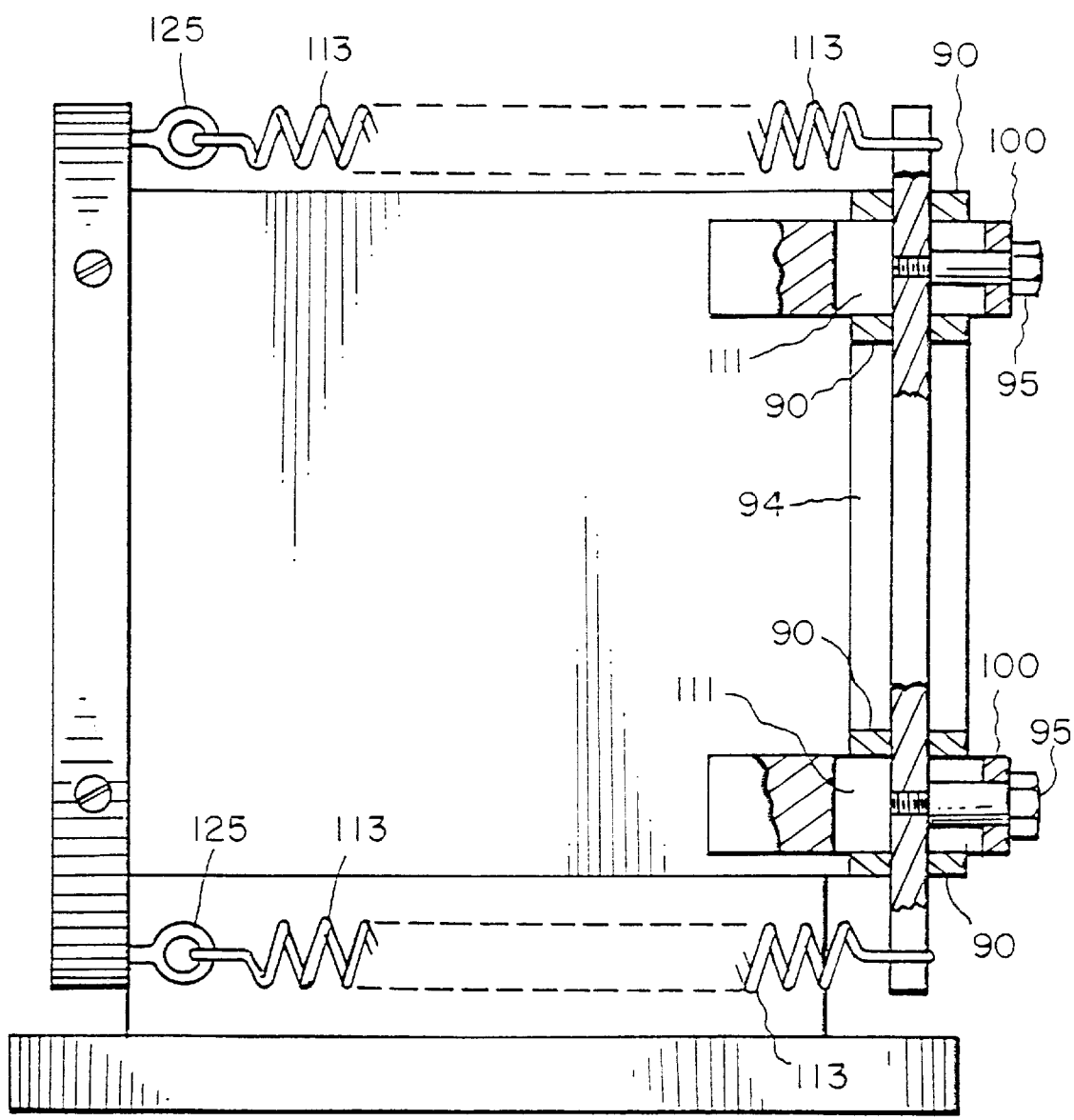
FIG. 6 is a side elevation, partially broken away, of an oven chamber according to the invention.
Figure 6A:
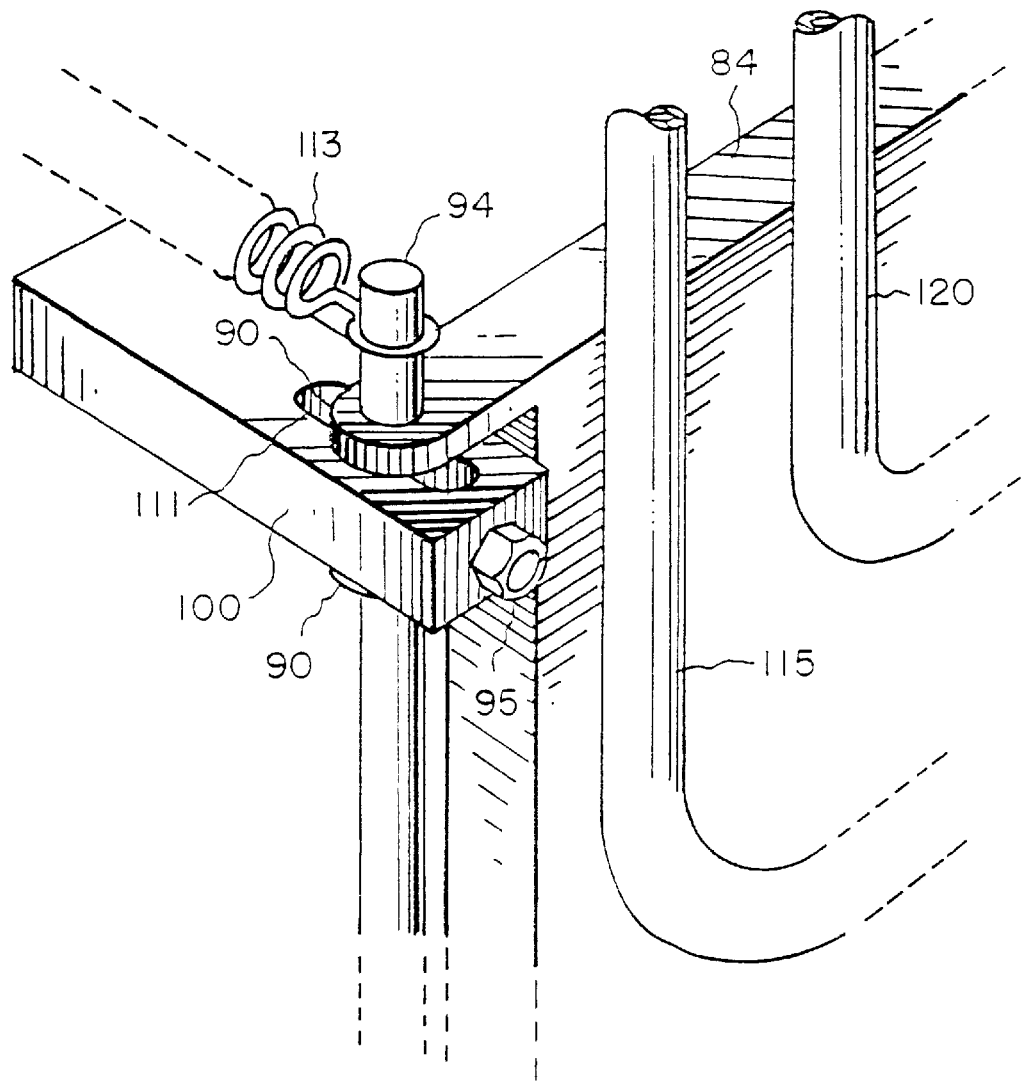
FIG. 6(a) is a perspective view, partially in phantom, of a door hinge assembly.

The invention provides a cube laminating oven assembly for simultaneously applying conductive heat, vacuum, and a force to a laminated integrated circuit device, or "cube". A currently preferred oven assembly 30 is shown in FIGS. 1–3. The oven assembly 30 has an oven chamber portion 34, at least one cube contact heating device 38, and at least one press device 40. As shown in FIG. 1, many such devices can be incorporated into the oven assembly 30 such that many cubes can be laminated simultaneously. The components can be individually controlled such that each cube that is being laminated can have different characteristics.

Cube Lamination Oven

The cube lamination oven of the invention includes the oven chamber 34, the heater assemblies 38, and the press devices 40. The press devices 40 can be located within the vacuum oven chamber 34, but preferably are provided outside of the oven chamber 34 where they can be enclosed by a press device housing 44. A press device actuator 47 is preferably also provided. A cooling gas inlet 45 is provided to introduce cooling gas into the oven, preferably through a tube 49 with openings 51 aimed at the cube fixture. Electrical connections can be provided by a cable 48 which connects to a high vacuum electrical connection 53, which can be any suitable high or medium vacuum electrical connection. The connection can terminate in a series of pins 55 inside the oven chamber 34 to which electrical connections for thermocouples and other electrical devices can be connected. A vacuum outlet 52 is provided to remove air from the oven.

Figure 14:
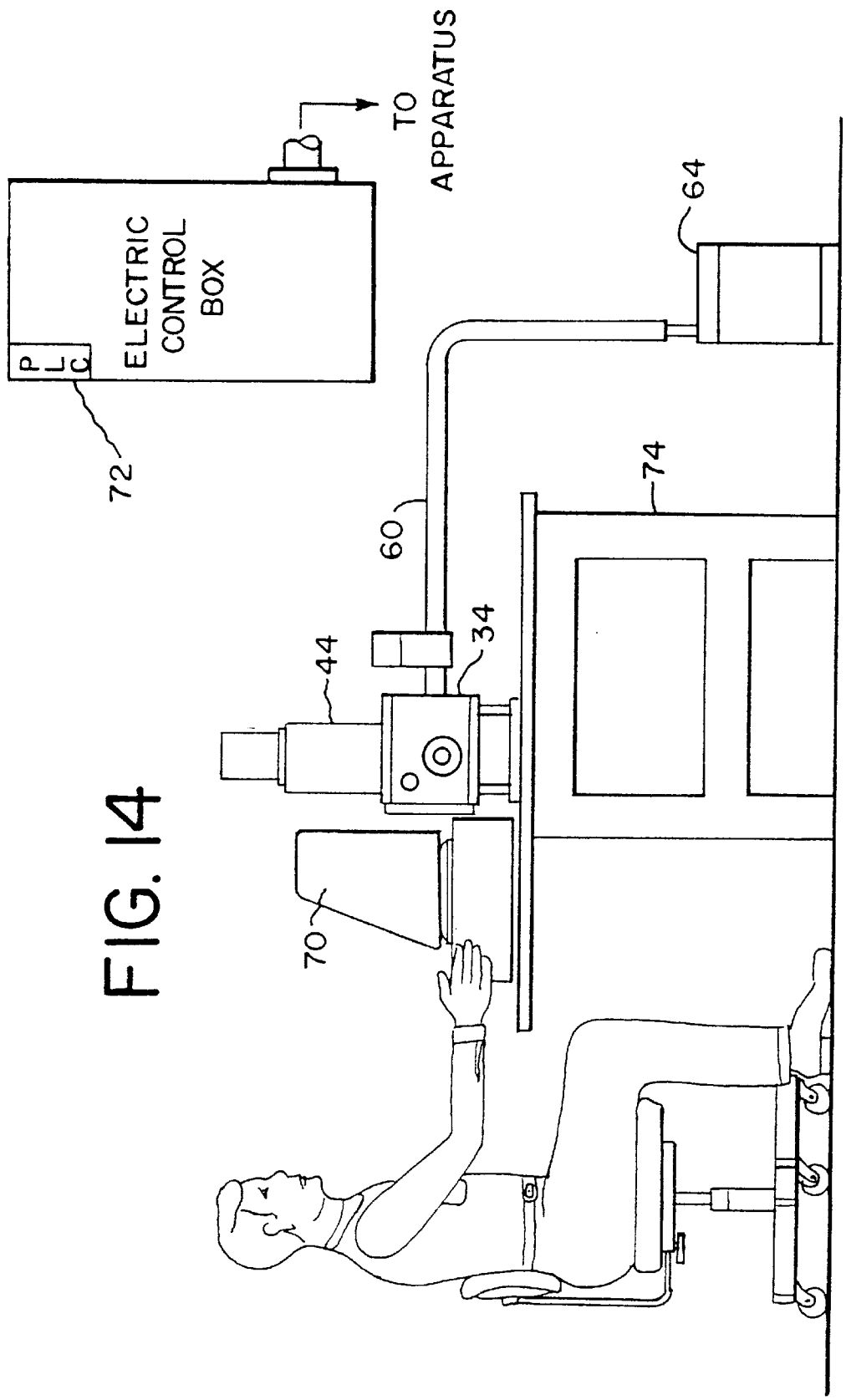
FIG. 14 is a side elevation of a cube laminating station according to the invention.
Figure 15:
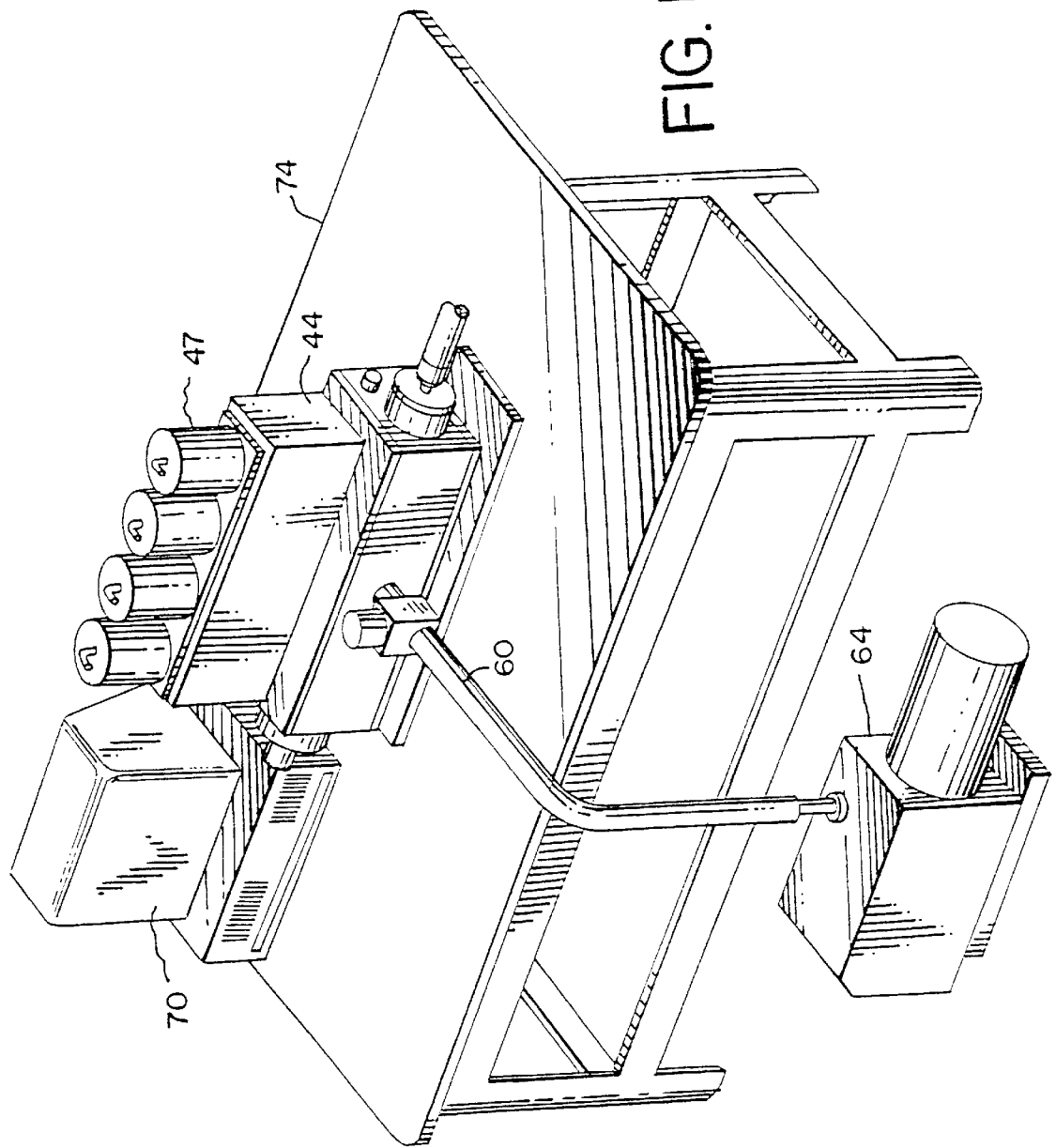
FIG. 15 is a rear perspective of a cube laminating station.

Peripheral devices can assist in the operation of the cube lamination oven. The vacuum outlet 52 can connect to a vacuum conduit 60 which connects to a vacuum source such as a vacuum pump 64 (FIGS. 14–15). The vacuum pump is preferably capable of drawing a vacuum of $10^{-3}$ torr or greater in the vacuum chamber 34.

The lamination oven 30 can also include various process sensing devices, including temperature sensors such as thermocouples and infrared detectors. Pressure sensors, load cells, and flow meters can also be included.

A personal computer 70 and/or another control device with sufficient processing power, such as a programmable logic controller (PLC), can be provided to permit the programming and feedback control of the laminating process (FIGS. 14–15). Also, the personal computer 70 can be used to download process control settings to a programmable logic controller 72, which can then signal the appropriate apparatus through suitable control circuitry. The lamination oven 30 according to the invention is compact, and can be provided on a table 74 or other suitable support for the convenience of the operator.

Vacuum Oven Chamber

The vacuum oven chamber must withstand vacuum greater than about $10^{-3}$ torr and temperatures greater than about 800° C. The vacuum oven chamber is therefore made according to known medium vacuum (to about $10^{-4}$ torr) fabrication techniques, and of a durable material such as stainless steel, preferably ¾ inch stainless steel. The stainless steel is selected to prevent outgassing. The vacuum oven chamber 34 is also designed according to known medium vacuum techniques to avoid pockets of air being trapped inside of the chamber, which might then leak out under the vacuum causing what is known as a "virtual leak". The oven chamber 34 can be constructed in many shapes and dimensions, but preferably is rectangular with sides 33, 35, and 37, top 39, base 41, and door 43.

The door 43 (FIGS. 3–6(a)) is used to provide access to the chamber 34 and to hermetically close the chamber 34 so as to withstand medium vacuum of up to $10^{-3}$ torr or greater. The door 43 preferably has sealing structure such as the O-ring 84 which seats against the front face 88 of the vacuum chamber 34 so as to tightly seal the chamber 34. Other suitable sealing structure is possible.

The door 43 can be mounted to the chamber 34 in any suitable fashion. In the preferred embodiment shown, the door has hinge arms 90 which fit over support posts 100 that are mounted to the chamber 34. A hinge pin 94 passes through a suitable opening in the hinge arms 90 and through slots 111 in the support posts 100 to secure the door 43 to the vacuum chamber 34. A locking bolt 95 extends through an aperture in the support posts 100 and is seated in the hinge pin 94 to vertically support the hinge pin 94.

A lock or latch of suitable design is also provided. The latch can include a clasp 104 and a loop 108, or can alternatively be of some other suitable design. A handle 109 is provided to lever the loop 108 to secure the loop 108 to the clasp 104. The loop 108 and handle 109 are hinged to a bracket 119 that is mounted to the door 43.

According to a preferred embodiment of the invention, the door hinge and/or latch are constructed so as to release nitrogen or cooling gas pressure in the event that this pressure becomes too high. The slots 111 in the support posts 100 are large enough to permit movement of the hinge pin 94, and thus the door 43. Springs 113 are connected to the hinge pin 94 and the rear side 33 of the chamber 34, as at eye bolts 125. A rise in pressure within the oven chamber 34 will cause the door 43 to move against the biasing of the springs 113 and away from its seat against the face 88 of the chamber 34 to release the pressure within the chamber 34. Also, the loop 108 can have a spring 117. The handle 109 and bracket 119 can slide over the loop 108, against the bias of spring 117, when there is a sufficient pressure in the oven chamber 34 to overcome the force of the spring 117. This will permit the release of pressure from the oven chamber 34. Other pressure relief structure, such as pressure relief valves, is also possible.

The door 43 and base 41 preferably have structure for cooling the door and base to remove heat that is generated by the conductive heating which takes place within the oven chamber 34. Preferably, cooling water channels are either formed in the door and/or base, or a cooling water conduit 121 can be fixed to the door and/or base. Water enters the channel through a cooling water inlet 115 and exits through an outlet 120. Cooling water can be supplied through an inlet conduit 124, and can be returned through an outlet conduit 128. It is also possible to provide cooling water flow channels to cool the sides 33, 35, and 37, or top 39, of the oven chamber 34.

The oven chamber 34 can be fitted with temperature sensing devices such as thermocouples. Structure is also preferably provided to facilitate the non-contact temperature measurement of a cube within the oven chamber. Windows 140 are preferably provided in the door 43 or other wall of the vacuum chamber 34. The windows are sealed with suitable vacuum fittings. The windows are made of an infrared-transparent material to permit direct non-contact temperature measurement of the cube using an infrared detector, such as the detector 141 shown in FIG. 16. A window 140 can be provided in the door 43 to align with each contact heater assembly 38. A currently preferred material for the windows is zinc selenide.

Cube Contact Heater Assembly

The cube contact heater assembly (FIGS. 7–9) preferably includes one or more conductive heating elements which heat the cube. At least two heating elements are preferably provided to apply conductive heat to the cube in different locations. This will help to prevent wide (more than about 5° C.) temperature differences, and the resulting stresses, in the cube. The heating elements may either contact the cube directly, or indirectly through one or more solid heat-conducting members. An upper heater 160 and a lower heater 164 are currently preferred. The upper heater 160 is shown in FIG. 7. Electrical power enters through cable 178, and is connected to a heating element 180. The heating element 180 is preferably provided in an enclosure 184. The heating element 180 must be capable of heating in a vacuum environment, without out-gassing, and should preferably be flexible to permit coiling into the enclosure 1 84. The enclosure 184 must be made of a material that will not out-gas, such as a low sulfur stainless steel, and should be capable of movement relative to the cube. The element 180 is preferably wound within the enclosure 184 in a coil 185, in order to better distribute the heat. A thermocouple can be provided for sensing the temperature of the upper heater 160. Thermocouple wires can enter the enclosure 184 through the cable 178. The power wires and the thermocouple wires are connected to suitable clips or other connections in a wall of the chamber 34 in a suitable medium vacuum electrical connection 179 (FIG. 2). The flexible wires permit the upper heater 160 to move up and down.

The enclosure 184 preferably comprises two portions, a lower portion 188 and an upper portion 190. These portions can be joined together by suitable structures such as screws, and when joined create a pocket to received the heating element 180. The upper portion 190 has a rounded top portion 194, that is preferably substantially semispherical, to provide a "point" contact with the force-applying member of the press device 40 that presses on it. This helps to alleviate alignment problems, and also reduces the conductive transmission of heat through the upper portion 190 and into the press device 40.

The lower heater 164 has a heating element 200. An electrical conduit 202 has sealed wires to provide electric power to the heating element 200. The conduit 202 is connected to a wall of the chamber 34 by a suitable vacuum connection 201. Thermocouple wires can also be provided in the lower heater 164 to sense the temperature of the lower heater. The element 200 is preferably enclosed by a base 206 and a cover 210. The base 206 has a depression 207, which with a cover 210 provides a pocket to receive the heating element 200 which is preferably shaped as a coil. The cover 210 rests over the element 200, and can be secured to the base 206 by suitable fastening structure such as screws 218 which are received in apertures 220. The base 206 can be incorporated as part of a pedestal 224 which can conveniently be placed into and removed from the oven. The pedestal 224 is comprised of legs 228 which can help to insulate the base 206 from the oven floor 41. The space 230 between the legs 228 can be positioned over a positioning member 236 (FIG. 1), which can have four ninety-degree legs to form a "+" shape, that is provided on the floor 41 to properly position each contact heater assembly within the oven chamber 34. The spaces 230 between the legs 228 fit over the legs of the positioning member 236 to provide secure positioning and engagement.

Structure is preferably provided for aligning the cubes on the contact heater assembly 38. Guide members 244 can be provided and have inside faces 248 which act to position the cube directly under the press device and between the upper and lower heaters at the most desirable position. Inwardly inclined wedge surfaces 250 can be provided to direct the cube into position between the inside faces 248 as it is pushed onto the contact heater assembly 38. The guide members 244 can be of any suitable construction, but preferably have lower depending flanges 264 which are secured to the base 206 by suitable structure such as screws 270 which pass through apertures 271 in the guide members 244 and engage apertures 273 in the base 206. A rear guide member 274 with an inside face 275 can also be provided to properly center the cube in the front-back direction. The rear guide member can similarly be secured by a depending flange 284 and screws 288. A switch 289 can be provided which is contacted by the cube and will indicate to the computer controls that the heater assembly 38 has a cube in place.

Structure is preferably provided to mount the upper heater 160 so that it is vertically movable over the base 206. Preferably, mounting posts 300 are provided. Each mounting post 300 can have a mounting pin 302 which is received by a mounting aperture 306 in the guide members 244. An upper socket portion 310 is adapted to receive a bolt 314. The bolt 314 and washer 320 can be used to engage a suitable aperture 328 in the upper heater 160 to secure the upper heater to the contact heater assembly. Springs 330 are used to bias the upper heater 160 upward so as to permit the insertion and removal of the cube fixture. The springs are preferably provided over the socket portion 310 and cooperate to urge the upper heater 160 away from the lower heater 164. The upper heater 160 will move downward against the spring biasing when the press device 40 pushes downward on the upper heater 160.

A cube fixture 332 is preferably provided for use in the oven assembly to hold the layers of the circuit cube together while the cube is being laminated. The fixture can be of any suitable design for retaining the circuit layers in stacked alignment within the heating assembly 38. The fixture should conduct heat and either be open topped or have a vertically movable cap to permit pressure from the press device 40 to act on the cube. The fixture preferably has a base and upwardly directed walls which contain the single layer integrated circuit cube. A cap can slide over or fit within the walls so as to be movable vertically relative to the base. The cap will then adjust to the necessary height for the height of the cube.

The upper heater 160, when pressed downwardly by the press device 40, will contact the cube or a cap and transfer heat by conductive means to the cube. Similarly, heat will be conducted from the lower heater 164 through the base and to the cube. The cube fixture preferably permits the infrared viewing of the cube for purposes of temperature measurement. Thermocouples, such as the thermocouple 339, should be either in contact with the cube or as close to the cube as possible. Thermocouple fittings can be provided in the cube fixture.

Figure 10:
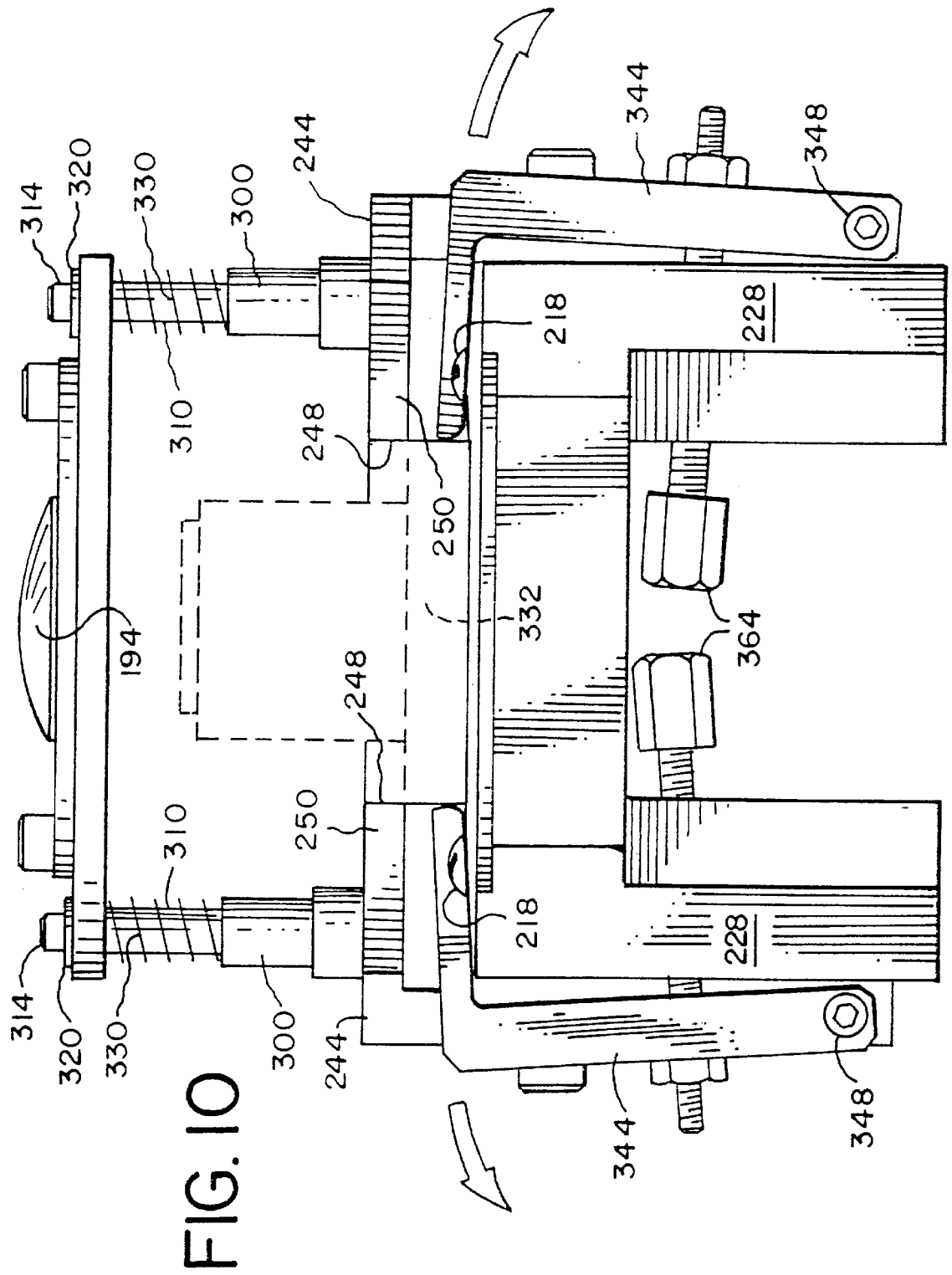
FIG. 10 is a side elevation of a cube contact heater assembly in a first mode of operation.
Figure 11:
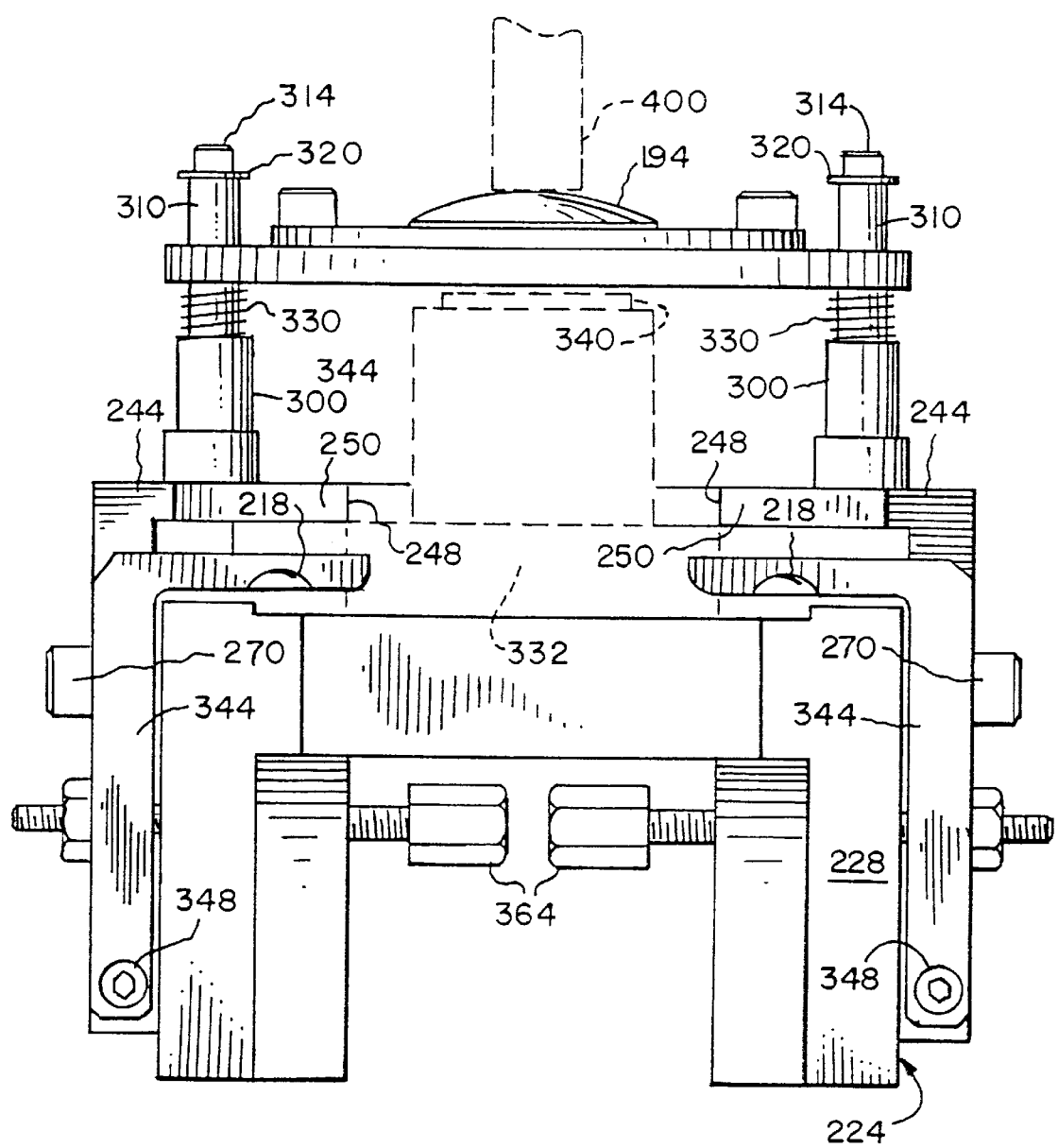
FIG. 11 is a side elevation of a cube contact heater assembly in a second mode of operation.

Structure is preferably provided for securing the cube or the cube fixture in the contact heater assembly 38. The securing structure can be any suitable structure, such as the clamps shown in FIGS. 7 and 10–11. The clamps 344 can be hinged by screws 348 or the like, which can be received in apertures 350 in the guide members 244. The clamps 344 can have inwardly directed locking arms 356. Inclined faces 360 are provided on the locking arms 356, such that when the inclined faces 360 are contacted by the cube or the fixture the clamps are pushed outwardly and pivot about the screws 348 (FIG. 10). Counterweights 364 or other suitable structure are provided to return the clamps 344 to the original position when the cube fixture is in place (FIG. 11). A pin 368 that can be biased by a spring 380 can be provided on the rear guide member 274 to bias the cube fixture against an inside face 370 of the locking arms 356. This will position the fixture in the desired position each time it is placed into the contact heater assembly 38.

Vertical Press Device

The vertical press device 40 is designed to apply significant mechanical force to the cube while it is heated in an oven chamber 34. The vacuum in the chamber 34 can reach $10^{-3}$ torr or more and the temperature of the cube can reach 340°–360° C. It is possible to construct a mechanical press device for inclusion inside the oven chamber 34 which will be capable of operating under this vacuum and when subjected to these temperatures, however, it has been found preferable to construct a press device outside of the oven chamber 34. The device is constructed in such a manner as to prevent the loss of vacuum and to isolate as much as possible the press device 40 from the elevated temperatures within the oven chamber 34.

Figure 12:
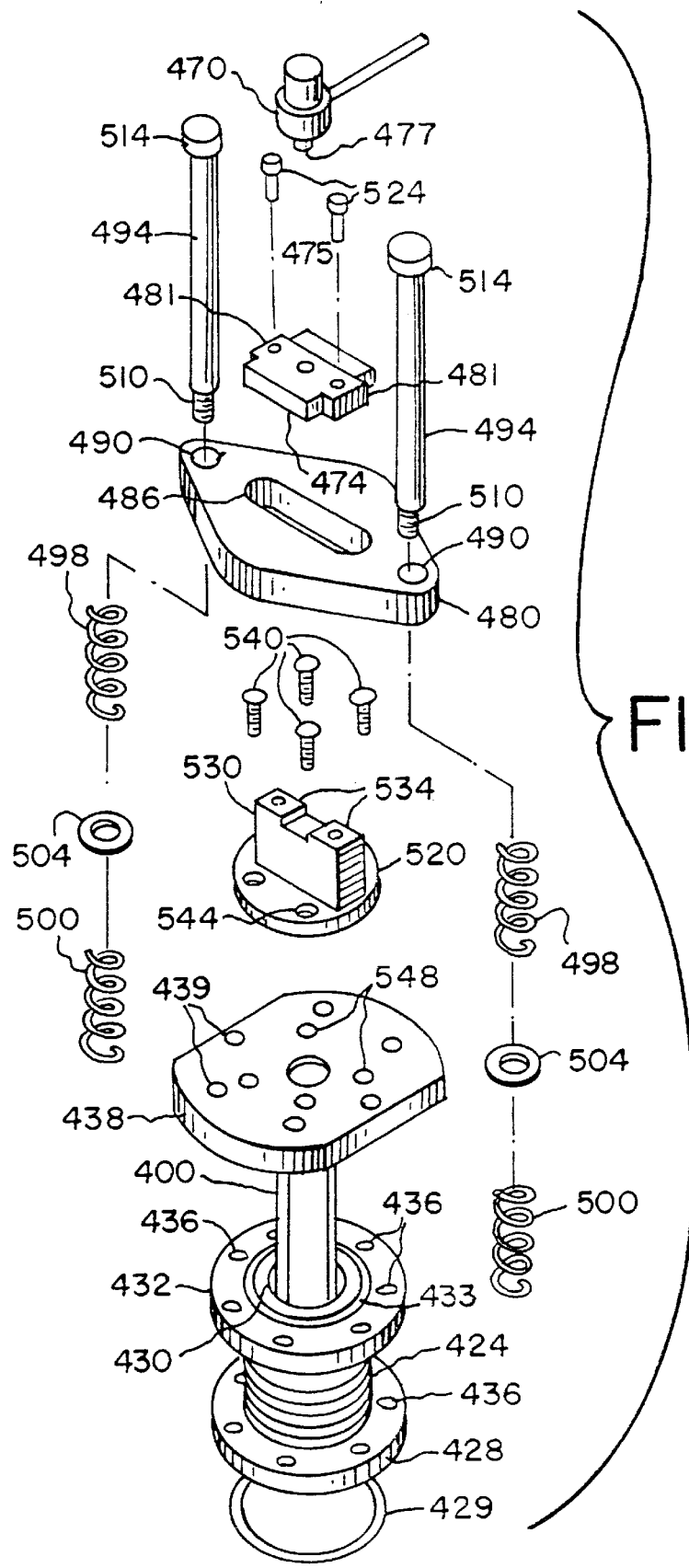
FIG. 12 is an exploded perspective of a portion of a press device according to the invention.
Figure 13:
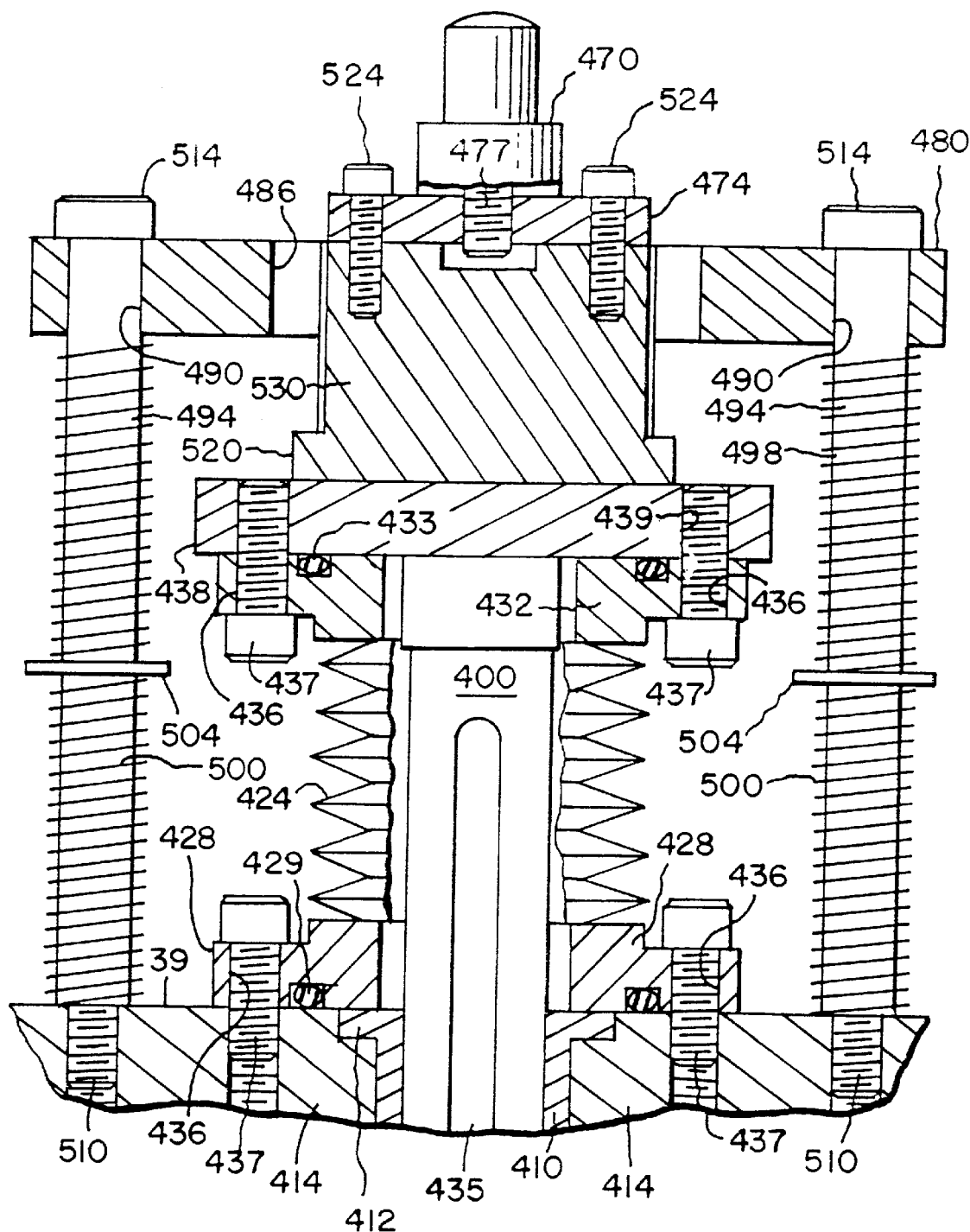
FIG. 13 is a side elevation, partially in cross section and partially broken away, of an assembled press device according to the invention.

The force generated by the press device can approach 100 lbs., and could require more in special applications. The press device 40 consists principally of a force-applying member 400 (FIGS. 12–13). The force-applying member 400 is preferably in the shape of an elongated shaft, but could alternatively be provided in different shapes. The shaft 400 extends through a suitable opening in the top wall 39 of the oven chamber 34 (FIG. 2). A fitting 410 loosely guides the shaft 400, and a flange 412 can secure the fitting in place over the opening. A surrounding structural fitting 414 can be provided, if necessary, to lend additional mechanical support to the assembly. The fitting 410 can be made of any suitable material capable of withstanding medium vacuum and high temperatures.

The shaft 400 must be tightly sealed in order to prevent the loss of vacuum. To accomplish this, a seal is provided on the outside of the oven chamber 34. A flexible seal is preferably provided in the form of a bellows or sheath. The sheath consists primarily of a flexible sheath 424 of a hermetic material (FIG. 13). The sheath 424 is preferably formed from a thin metal that can withstand medium vacuum, such as stainless steel. The sheath 424 is preferably hermetically attached to the top wall 39 and to the shaft 400, to hermetically seal the shaft 400 in the opening.

The sheath 424 can have a base plate 428 and an upper mounting plate 432. The base plate 428 is mounted to the upper surface of the top wall 39. The base plate 428 and the upper mounting plate 432 can have suitable fastening structure such as apertures 436 to receive suitable fasteners such as screws 437. Alternatively, the sheath can be secured by other suitable fastening means. A central opening 430 extends through the upper mounting plate 432, the sheath 424, and the base plate 428 to permit the shaft 400 to extend into the oven chamber 34.

The shaft 400 can have an end plate 438 at an end distal to the oven chamber 34. The space surrounding the shaft 400 can be completely sealed against the loss of vacuum through leakage around the shaft 400 by suitable sealing structure such as o-ring 429 in the base plate 428 and o-ring 433 in upper mounting plate 432. These o-rings seal the base plate 428 against the top 39 of the chamber 34, and seal the upper mounting plate 432 against the end plate 438. Screws 437 can engage apertures 439 in the end plate 438 to secure the upper mounting plate 432 to the end plate 438 (FIG. 13).

Air and other gases may accumulate within the sheath 424 when the oven is opened, since air can leak past the fitting 410. It is desirable to provide structure for removing this gas when the vacuum is created in the oven chamber 34. Channels 435 can be provided in the shaft 400 to facilitate the withdrawal of air and gas from within the sheath 424 when the vacuum is applied to the oven chamber 34.

The shaft 400 is manipulated by a drive shaft 440 (FIG. 2). The drive shaft 440 is connected to the actuator 47, which can be pneumatic or electric. In the preferred embodiment, the actuator is pneumatic and receives power through a pressurized line 450 which connects to a suitable fitting 454. A piston 464 is connected to a cylinder adapter 456. A fastener such as a bolt or screw 460 is used to connect the cylinder adapter 456 to a plunger 458. The plunger 458 has side walls 459 and an inside top surface 461 which rest around and over load cell 470. The side walls 459 define openings in the front and rear of the plunger 458 to permit air to flow through the plunger over the load cell 470. The load cell 470 can be selected from any suitable load cell for this purpose. Preferably the load cell is of the compression type, with a linear voltage output, and a range that is preferably between 0–500 lbs. A sensor wire 472 is provided to convey load cell signals to the control system. The load cell is connected to a load cell plate 474. An aperture 475 in the load cell plate 474 receives a portion 477 of the load cell 470 to secure the load cell in place. Surfaces 481 can be provided on the load cell plate 474 and are engaged by the side walls 459 of the plunger 458 to prevent rotation of the plunger 458. The surfaces 481 can be omitted if the pneumatic actuator is keyed to prevent rotation.

The load cell plate 474 abuts a biasing plate 480. The biasing plate 480 has an elongated slot 486. Apertures 490 in the biasing plate 480 receive shoulder bolts 494 or other suitable fastening structure. The shoulder bolts 494 extend through the apertures 490 and engage suitable biasing structure such as springs 498, 500, which can be separated by washers 504. Threaded ends 510 of the shoulder bolts engage suitable openings in the upper surface of the top wall 39 of the chamber 34 (FIG. 13). The biasing plate 480 will be biased upwardly by the springs 498, 500. Enlarged heads 514 of the shoulder bolts 494 secure the biasing plate 480 on the shoulder bolts 494.

A spacer plate 520 is attached to the load cell plate 474 by suitable structure such as screws 524. An upwardly extending guide 530 includes apertures 534 to receive the screws 524. The guide 530 is dimensioned to fit into the slot 486 in the biasing plate 480. The spacer plate 520 can be attached to the end plate 438 by suitable structure such as screws 540 which pass through apertures 544 in the spacer plate 520 and engage threaded apertures 548 in the end plate 438. The spacer plate 520 spaces the end plate 438 from the load cell plate 474, and permits the biasing plate 480 to move freely over the guide 530 between the load cell plate 474 and the end plate 438.

In operation, the biasing plate 480 will be urged by the springs 498, 500 away from the top wall 39. The biasing plate 480 will contact the load cell plate 474. The load cell plate 474 is connected by the spacer plate 520 to the end plate 438 and the shaft 400, and the action of the springs and biasing plate 480 will be to lift and retain the shaft 400 in a position that is out of contact with the contact heater assembly 38.

Downward movement of the drive shaft 440 and piston 464 will move the side walls 459 of the plunger 458 into contact with the biasing plate 480. The biasing plate 480 is moved downwardly over the guide 530, against the biasing of the springs 498, 500, to a position between the end plate 438 and the load cell plate 474. The load cell 470 is then contacted by the inside top surface 461 of the plunger 458, and the load cell 470, load cell plate 474, and spacer plate 520 move in tandem to urge the end plate 438 and shaft 400 into contact with the heater assembly 38. The load cell 470 will thereby not give false readings resulting from the action of the springs 498, 500.

It can be seen that the shaft 400 will move upward and downward in tandem with the sheath upon operation of the actuator 47. The load cell 470 will provide an accurate reading of the force that is being applied by the shaft 400. The springs 498, 500 acting on the plate 480 will act to lift the shaft out of the oven chamber 34 except when a downward force is applied by the actuator 47. It may be possible to avoid the use of springs 498, 500 if a double-acting actuator is provided, which will lift the shaft 400 out of contact with the heater assembly 38 in addition to forcing the shaft 400 downward against the assembly.

Process Control

The process of the invention is preferably computer controlled by the computer 70, a programmable logic controller, or any other device with sufficient processing power and suitable interface circuitry. Three major programs are currently preferred. A first program is the operator interface and recipe creation software. A second is the trending software. The third is the process control program. These programs can be any suitable software designed to control the process according to the principles described herein.

The operator interface and recipe creation software can be provided by commercially available software programs that create a graphical user interface and a recipe creation facility. A suitable operator interface software is Winview or RSview manufactured by Rockwell Software of Milwaukee, Wis. This software package runs on a personal computer in a Windows® environment and is customized by creating pictures with animations, state changes, digital displays, buttons, lights and the like and assigning them to memory addresses in a programmable logic controller (PLC) which runs the process control program. The operator interface software on the PC communicates to the PLC, if present, via a standard hardware communications interface such as RS-232. Product/process recipes are also created, selected and downloaded from the operator interface program to the PLC program. The product/process recipe contains values such as temperature set points, temperature ramp rates, force ramp rates, temperature offsets, dwell time, temperature trigger points, and the like.

The trending software can also be selected from commercially available software packages, such as RSTREND manufactured by Rockwell Software. This software is also preferably capable of running on a personal computer in a Windows® environment and is configured to create a strip chart record of the cube lamination process. The trending software records values such as temperature, force, vacuum and the like, and can print out a chart record of these values for hard copy records. The trending software preferably also communicates to the process control program via an appropriate interface such as RS-232 interface in similar fashion to the operator interface and recipe creation software.

The process control program (PCP) can be programmed in ladder logic programming language and runs on the programmable logic controller. The PCP is designed to control the one or more contact heater assemblies in the vacuum chamber 34 independently. The PCP also performs proportional integral derivative (PID) functions. Twelve such functions are currently preferred. Eight PID functions are for temperature control, two for each of the four contact heater assemblies 38 in the preferred embodiment. Four PID functions are for force control, one for each press device 40. The PCP also accepts product recipe downloads from the operator PC, as well as characterization value downloads. The PCP also contains separate subroutines for independent temperature set point ramping and steady state timing, as well as for temperature triggered force set point ramping.

The characterization values are required due to slight differences between the contact heater assemblies such as thermocouple calibration, heater wattage, and heat transfer efficiency. The characterization values are determined empirically from test runs that are conducted to measure these differences. The characterization values are subtracted or added to some of the product/process recipe values such as temperature set points and offsets. It may be possible to perform the process without some characterization values with good temperature and force sensing, and with suitable feedback controls.

A substantially uniform temperature, with a variance of no more than about 5° C., preferably is maintained from top to bottom of the cube. The dual heater system of the preferred embodiment, utilizing the upper heater 160 and the lower heater 164, must be controlled due to the larger heat sink of the lower heater 164. The upper heater 160 is therefore slaved to the lower heater 164, and is controlled to maintain an assigned temperature difference between the heaters. The PLC switches both the upper heater's slave relationship and slave offset from following the lower heater's temperature during the ramp to the first cube temperature set point, to a constant value at the second cube temperature set point. The switching of the slave relationships and offsets is required due to the different temperature gradients which develop in the contact heater assembly, fixture and cube during ramping conditions as opposed to steady state conditions.

In a preferred system, an operator interface is provided by an IBM® PC running PCDOS 6.3; Windows 3.1; and Winview or RSview (Supervisory Control And Data Acquisition) operator interface and recipe creation application. A trend chart reporting function is performed by RSTrend. WinLinx provides a communications driver allowing RStrend and Winview to communicate to the PLC via RS-232. The preferred PLC is an Allen Bradley SLC-500. The PLC runs a ladder diagram program which controls all tool functions. The PLC has special I/O modules. A digital input module interfaces to switches in the oven which indicate that a cube fixture is present and that cooling gas and pneumatic pressure are present. Digital output modules drive 24 VDC relays and solenoid valves on the oven which turn heater power, vacuum, and water on and off. Analog input modules receive voltage or current signals from the load cells for force sensing, the IR sensor for temperature sensing, and a vacuum gauge for vacuum sensing.

Analog output modules drive silicon controlled rectifiers (SCR) which control the proportional power to all heating elements. Thermocouple input modules receive signals from all the thermocouples for temperature measurement.

Figure 18A:
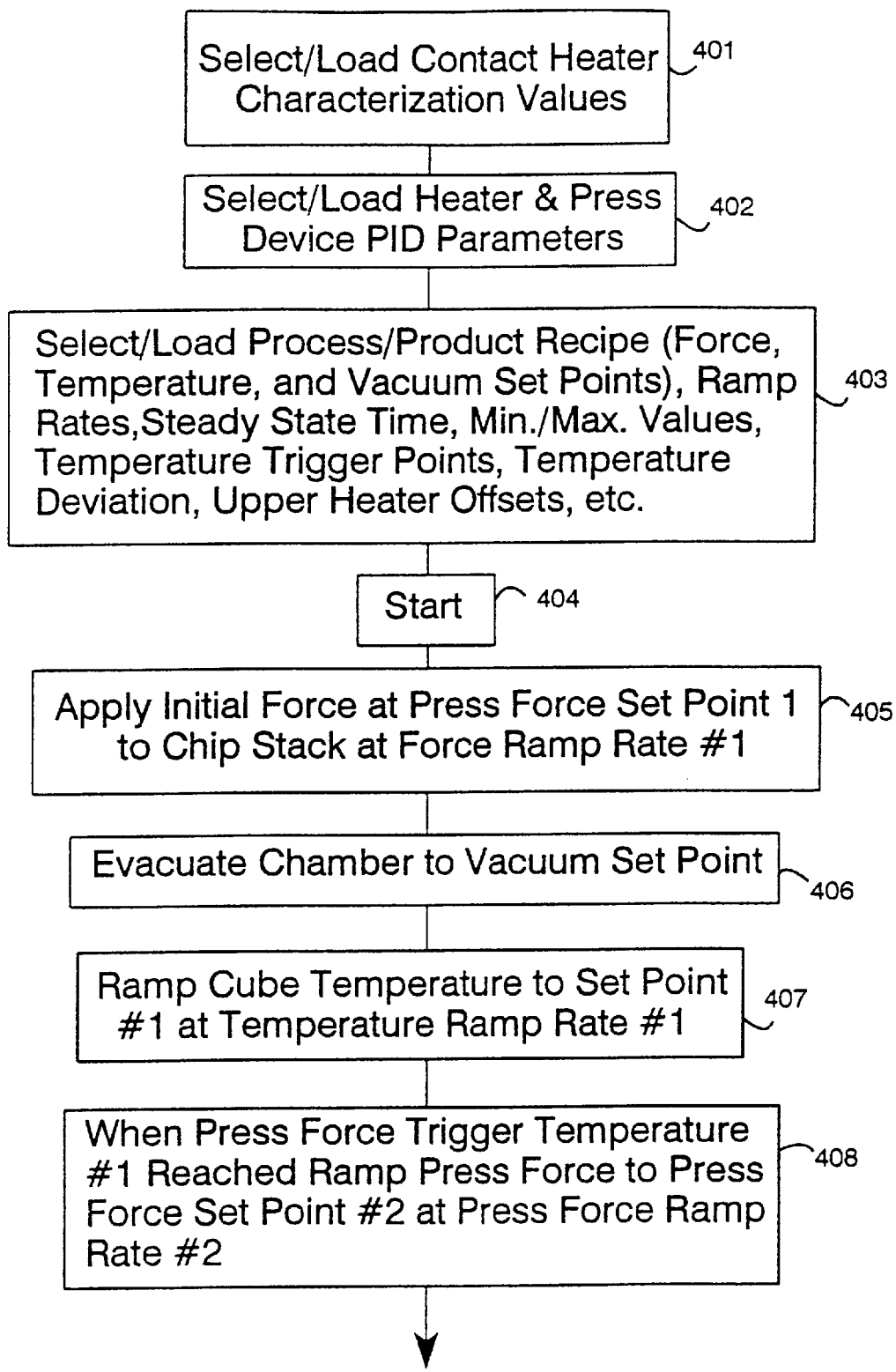
FIG. 18(a–b) is a flow chart of a process according to the invention.
Figure 18B:
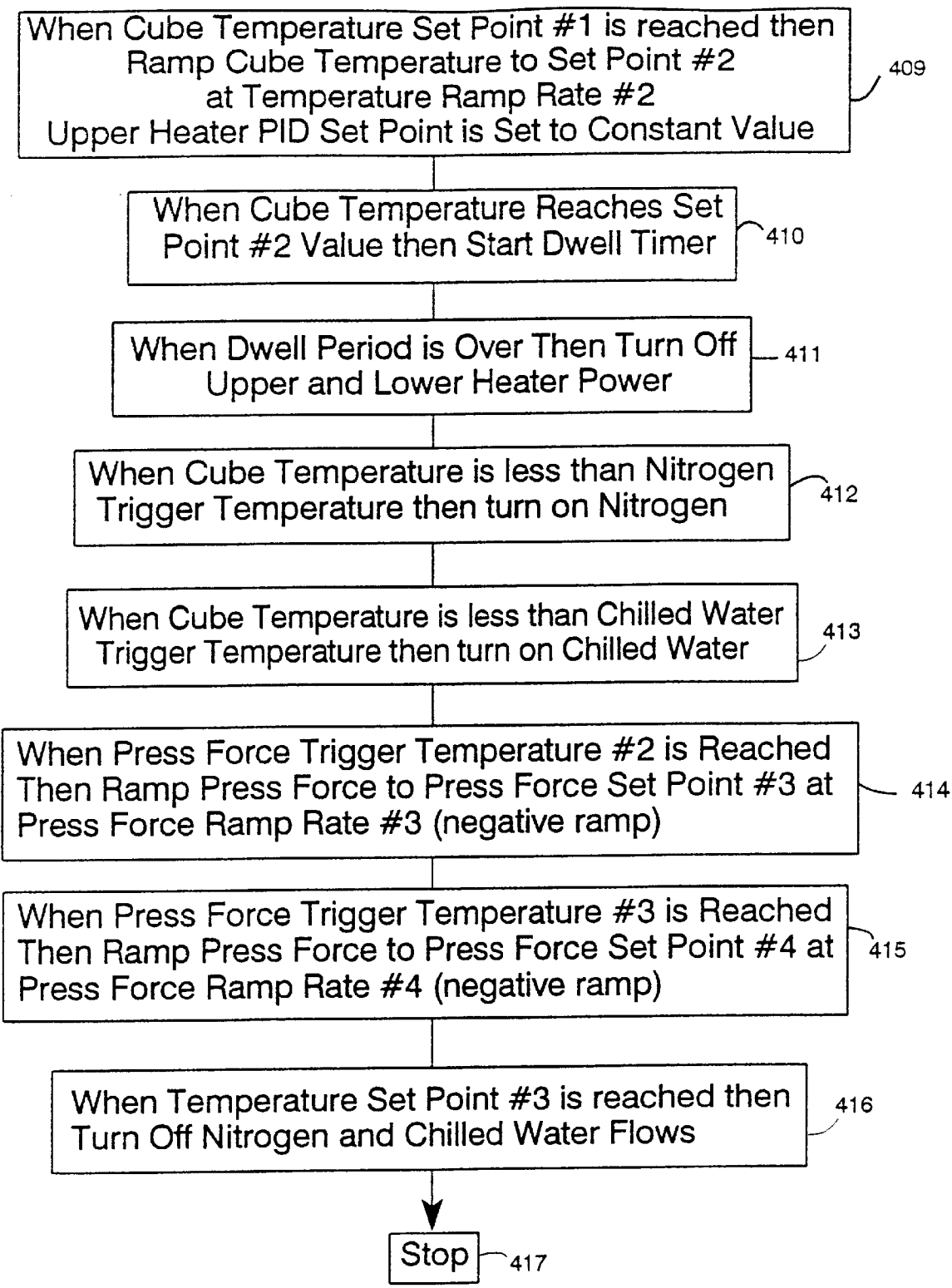

The process flow chart shown in FIG. 18(a–b) provides a simplified sequence of a single station process according to the invention. A plurality of station processes can be performed simultaneously. In block 401, the characterization values are downloaded only when changes are made to the contact heater assembly 38 such as thermocouple, heater changes and some mechanical changes such as materials, geometry, surface finish, or anything else that would affect heat transfer or require a different calibration. This is to account for slight differences in heat transfer efficiency. The PID parameters are similarly downloaded as shown in block 402. These are gain, integral and derivative values used in the computer PID function. These process values are used to control all heater assembly temperatures and press forces. A product/process recipe is selected which remains in effect until a new recipe is downloaded as shown in block 403.

Figure 16:
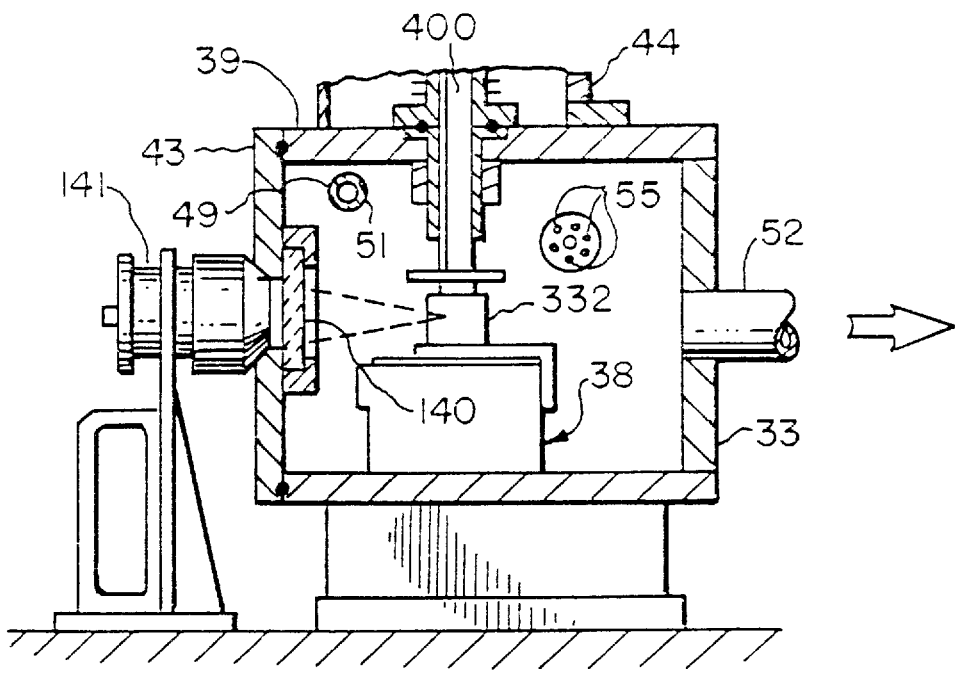
FIG. 16 is a cross section of an oven chamber in a first mode of operation.

The start is initiated at block 404 by operating a start button. A force is applied to the chip stack by the press device in block 405. This is also illustrated in FIG. 11 and 16. The vacuum valve is opened and the chamber is evacuated to a recipe vacuum set point, as shown in block 406. In block 407, the cube stacking fixture is heated at temperature ramp rate number 1 to temperature set point number 1. When the cube temperature reaches press force trigger temperature number 1, the press force is ramped to press force set point number 2, as shown in block 408. Temperature set point number 1 is the temperature at which the temperature ramp rate is changed to temperature ramp rate number 2, as shown by block 409. Heating continues at this new (usually slower) ramp rate until the temperature of the cube reaches temperature set point number 2. The upper heater is no longer slaved to the lower heater, but is instead given a constant value temperature set point, to allow the cube to attain a substantially uniform steady state temperature.

Figure 17:
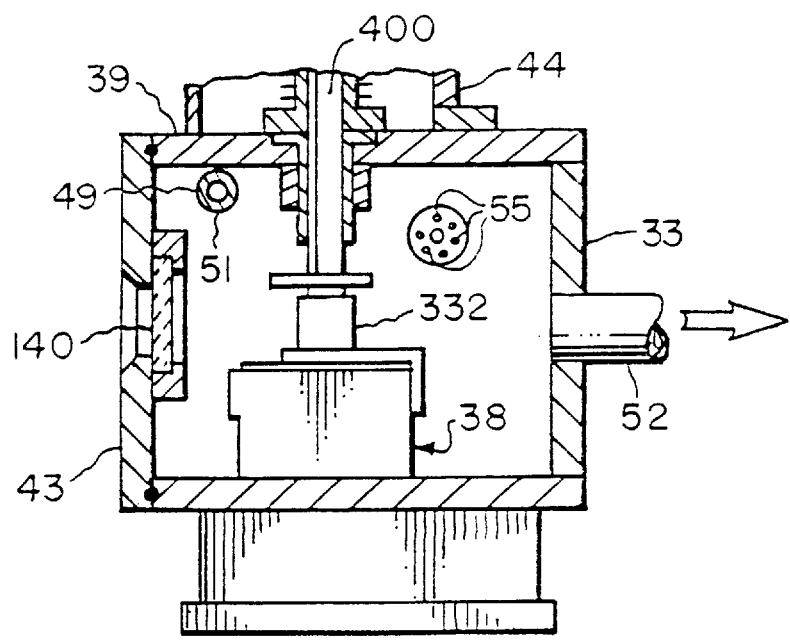
FIG. 17 is a cross section of an oven chamber in a second mode of operation.

Temperature set point number 2 is the temperature at which the cube will be cured, and the temperature is maintained at this value for a dwell period. A timer is started to measure the dwell period, as shown in block 410. When the dwell period has expired, the power to the heaters is turned off, as shown by block 411. Cooling gas is allowed to flow into the oven chamber 34 when the cube temperature reaches the nitrogen trigger temperature, as shown in block 412. The flow of nitrogen is balanced with the vacuum pump to maintain a slight vacuum in the oven chamber (illustrated by arrows in FIG. 17). Chilled water is circulated through the chamber walls to speed up the cooling cycle when the temperature falls below the chilled water trigger temperature, as shown in block 413.

The press force is negatively ramped to press force set point number 3 when the temperature reaches press force trigger temperature number 2, as shown in block 414. When the cube temperature falls below press force trigger temperature number 3, the force of the press device is ramped down to press force set point number 4 (usually 0), as shown in block 415. The nitrogen gas and chilled water can be turned off at cube temperature set point number 3, as shown in block 416. The process ends at block 417, whereupon the finished laminated integrated circuit cube can be removed from the oven.

The particular process parameters that are used can be varied according to such factors as the type of adhesive that is used, the size and construction of the cube that is being fabricated, the materials making up the cube, and the type and construction of the heating assembly and press device.

It is most desirable that the vacuum be sufficiently high that substantially all gases be removed from between the circuit layers by the vacuum. The press force must be high enough to produce a compact, well-adhered cube, but must not be so high as to cause structural damage to the cube. The temperature must be high enough to effectively cure the adhesive, but must not be so high that damage to the cube and circuits results. The temperature will therefore be varied according to many factors, including the nature of the adhesive and the cube material. Uniform heating across the cube is desirable. The following example is therefore provided as an illustration of a currently preferred process, and it should be appreciated that other process parameters could be desirable depending on the particular product and process characteristics.

The vacuum is selected to insure the removal of substantially all of the gas that may be between the circuit layers of the cube prior to heating, and can be adjusted as necessary. It is currently preferred that a minimum vacuum of $4 \times 10^{-2}$ torr be created in the oven chamber prior to heating. The pump will continue to draw down vacuum, eventually reaching between about $3 \times 10^{-3}$ torr and about $7 \times 10^{-3}$ torr.

A light force is preferably applied by the press device 40 at the beginning of the process to cause the upper heater to move down and securely contact the cap of the fixture for heating. A force of 1–20 lbs is preferred for press force set point number 1, and is achieved at force ramp rate number 1, preferably about 1 lb./sec. The conductive heating then begins so as to raise the temperature of the cube at a temperature ramp rate. The ramp is selected from a recipe, but is initially determined empirically. A temperature ramp rate that is too high will cause stresses in the cube. A ramp rate that is too low will needlessly lengthen the process.

Preferably, an initial temperature ramp rate and a second temperature ramp rate are used. A reduced second temperature ramp rate can reduce the temperature overshoot typical in an underdamped control system. An initial temperature ramp rate of about 8° C./min is preferred, and initial temperature ramp rates of between about 1° C./min and about 12° C./min are preferably used. The heating continues at the initial temperature ramp rate until the temperature of the cube reaches cube temperature set point number 1, about 340° C. The heating then continues at a slower second temperature ramp rate of about 0.5° C./min until the cube reaches cube temperature set point number 2, currently about 345° C.

In one recipe, the slave relationship between the upper heater and the lower heater sets the upper heater to be 125° C. above the lower heater temperature From cube temperature set point number 1 through the end of the dwell period, the upper heater temperature is adjusted to be 437° C. higher than cube temperature set point number 2.

The initial force is maintained until the temperature reaches an initial press force trigger temperature. Heating the cube under a light force and under vacuum will give gas trapped between the chip layers time to escape. Higher initial forces would make this escape more difficult. This press force trigger temperature is selected from the recipe, and is initially determined empirically. A currently preferred press force trigger temperature number 1 is about 250° C. The force applied to the cube by the press device 40 is then ramped up to press force set point number 2. The press force ramp rate number 2 is currently about 5 lb/sec, and press force set point number 2 is about 94 lbs. The press force set points can be any between about 0 lb. and about 100 lb. Higher forces can be attained in particular circumstances.

The cube temperature set point number 2 is maintained for a period of time that is sufficient to permit the curing of the adhesive, referred to as the dwell time. The dwell time that is currently preferred is about 30 minutes, but could change with different adhesives or different cube constructions. Press force set point number 2 is maintained until press force trigger temperature number 2 is reached.

The completion of the temperature dwell cycle is followed by a cooling cycle. The nitrogen trigger temperature and chilled water trigger temperature are currently about 340° C. The cooling rate is determined by the flow of cooling gas into and out of the chamber. A currently preferred cooling rate is about −10° C./min. Press force trigger temperature number 2 is provided to begin the reduction of the press force. Press force trigger temperature number 2 is currently about 200° C. The press force is then reduced, at press force ramp rate number 3, about −5 lb/sec, to press force set point number 3, between about 1–20 lbs. When press force trigger temperature number 3 is reached, about 101° C., the press force is ramped to press force set point number 4, usually 0 lbs, at press force ramp rate number 4, about −5 lb/sec. At the end of the process, all fixture temperatures are less than or equal to cube temperature set point number 3. The time for the total process is currently about 120 min to about 150 min.

The process is preferably controlled using suitable feedback control methods. Closed loop control methods, such as Proportional Integral Derivative (PID) methods, are currently preferred.

Although the invention has been particularly described for making laminated integrated circuit cubes, it will be apparent to one skilled in the art that the invention has utility for heat-curing other workpieces where it is desirable to remove air and other gases from between portions of the workpiece and to tightly adhere such portions together. This invention can be provided in other specific embodiments without departing from the spirit or essential attributes thereof, and accordingly, reference should be had to the following claims, rather than the foregoing specification, as indicating the scope of the invention.

We claim:

1. An apparatus for producing laminated integrated circuit cubes, comprising:

a hermetically sealable oven chamber;

a mechanical press device capable of applying pressure to the cube when the cube is inside the chamber;

at least two conductive heaters for applying conductive heat to at least two portions of said cube, said heaters including an upper heater and a lower heater, each of said heaters comprising a heating element and a cover, said upper heater having structure for contacting said press device, said structure comprising a substantially semispherical surface; and, means for creating a vacuum in the chamber.

2. The apparatus of claim 1, wherein at least the upper heater is movable relative to the cube.

3. The apparatus of claim 1, wherein the lower heater is provided in a heating assembly, said heating assembly further comprising structure for fixing the cube in a desired position.

4. The apparatus of claim 3, when said fixing structure includes retractable clamp structure.

5. The apparatus of claim 1, further comprising structure for introducing a cooling gas into said oven chamber.

6. The apparatus of claim 1, further comprising structure for determining the temperature of said cube.

7. The apparatus of claim 6, wherein said structure comprises thermocouples.

8. The apparatus of claim 6, further comprising structure for taking infrared heat measurements of said cubes.

9. The apparatus of claim 1, wherein said oven chamber further comprises infrared-transparent windows for taking infrared measurements of cubes in said oven chamber.

10. The apparatus of claim 1, wherein said windows are provided in a door to said oven chamber.

11. The apparatus of claim 1, further comprising structure for cooling said oven chamber, said structure comprising cooling fluid channels.

12. The apparatus of claim 1, further comprising structure for positioning said cube relative to at least one of said conductive heater and said mechanical press device.

13. The apparatus of claim 1, further comprising a programmable controller, said programmable controller being adapted to control at least one of said conductive heating elements, press device, and a cooling gas.

14. The apparatus of claim 1, wherein said press device comprises a shaft movably mounted through an opening in said enclosure, and comprising hermetic sealing structure about said opening and said shaft.

* * * * *